(12) United States Patent
Despesse et al.

(10) Patent No.: US 10,819,235 B2
(45) Date of Patent: Oct. 27, 2020

(54) POWER CONVERTER

(71) Applicant: Commissariat à l'Énergie Atomique et aux Énergies Alternatives, Paris (FR)

(72) Inventors: Ghislain Despesse, Voreppe (FR); Benjamin Pollet, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/576,182

(22) Filed: Sep. 19, 2019

(65) Prior Publication Data

US 2020/0099297 A1 Mar. 26, 2020

(30) Foreign Application Priority Data

Sep. 21, 2018 (FR) ..................... 18 58613

(51) Int. Cl.
*H02M 3/158* (2006.01)
*H01L 41/107* (2006.01)
(Continued)

(52) U.S. Cl.
CPC .......... *H02M 3/158* (2013.01); *H01L 41/107* (2013.01); *H02M 7/217* (2013.01); *H02M 2001/0058* (2013.01)

(58) Field of Classification Search
CPC ..... H01L 41/00; H01L 41/042; H01L 41/044; H01L 41/107; H02N 2/0075; H02M 3/158; H02M 7/217
See application file for complete search history.

(56) References Cited

U.S. PATENT DOCUMENTS 6,016,052 A * 1/2000 Vaughn ................. H01L 41/044
323/355
2006/0097707 A1* 5/2006 Inoshita .............. H02M 3/1582
323/222
(Continued)

FOREIGN PATENT DOCUMENTS

CN 102522492 A 6/2012
CN 101938220 A 8/2014
WO WO 2009/101176 A1 8/2009

OTHER PUBLICATIONS

Preliminary Search Report for French Application No. 1858613, dated Jun. 7, 2019.
(Continued)

*Primary Examiner* — Gary L Laxton
(74) *Attorney, Agent, or Firm* — Wolf, Greenfield & Sacks, P.C.

(57) ABSTRACT

A power converter including: a first branch and a second branch of at least two series-connected switches each, coupled in parallel between a first terminal and a second terminal and having the junction points of their switches coupled to two terminals of application of a first voltage; a third branch and a fourth branch of at least two series-connected switches each, coupled in parallel between a third terminal and a fourth terminal, and having the junction points of their switches coupled to two terminals for supplying a second voltage; and at least one piezoelectric element coupling the first terminal to the third terminal.

11 Claims, 13 Drawing Sheets

(51) Int. Cl.
*H02M 7/217* (2006.01)
*H02M 1/00* (2006.01)

(56) References Cited

U.S. PATENT DOCUMENTS

| | | |
|---|---|---|
| 2017/0012556 A1 | 1/2017 | Jeong et al. |
| 2018/0130940 A1* | 5/2018 | Chaput ................ H02M 7/537 |
| 2019/0020269 A1* | 1/2019 | Ekhtiari ............ H02M 3/33584 |

OTHER PUBLICATIONS

Erickson et al., Resonant Conversion. Fundamentals of power electronics. Springer Science & Business Media; Dec. 31, 2001:705-55.

* cited by examiner (a)

(b)

(c)

POWER CONVERTER

CROSS REFERENCE TO RELATED APPLICATIONS

This application claims priority to French patent application number 18/58613, filed on Sep. 21, 2018, the content of which is hereby incorporated by reference in its entirety.

BACKGROUND

The present disclosure generally concerns electronic power conversion systems and, more particularly, the forming of a DC/DC or AC/DC converter. The present disclosure more particularly concerns a converter comprising a piezoelectric material.

DISCUSSION OF THE RELATED ART

The power converters of electronic systems may be based on different principles.

A first category concerns converters based on the use of transformers. Most transformers are based on inductive windings, but piezoelectric transformers can also be found. The latter transform an AC voltage into another AC voltage with a different amplitude and require, like magnetic transformers, converting the DC input voltage into an AC voltage and then rectifying the AC voltage supplied by the transformer.

A second category concerns switched-mode power supplies, which use an inductive power storage element and which cut off a DC input voltage, generally in pulse-width modulation, to regulate the value of a DC output voltage.

A third category concerns converters based on the use of a micro electromechanical system (MEM). Such systems use a variation of the capacitance of an electromechanical element to convert energy of electrostatic nature. Documents U.S. Pat. Nos. 6,317,342 and 6,058,027 for example describe such converters.

A fourth category, to which the present invention applies, concerns converters using the resonance of a piezoelectric material. For example, document KR-A-20100137913 describes an example of a converter comprising a piezoelectric transducer where the output voltage is regulated by adjusting the frequency of phases at constant voltage and of phases at constant charge, as a switched-mode capacitance circuit.

Document US-A-2107/012556 describes a DC-AC power converter comprising a piezoelectric transformer.

Document CN-B-101938220 describes a high-power piezoelectric power converter.

Document CN-A-102522492 describes an AC/DC power converter comprising a piezoelectric transformer.

SUMMARY

An embodiment overcomes all or part of the disadvantages of known power converters.

An embodiment provides a solution using the advantages of piezoelectric materials.

An embodiment provides a solution enabling to regulate the output voltage of the converter according to the needs of the load.

An embodiment provides a converter architecture compatible with a use as a DC/DC, AC/DC, buck, boost, or buck-boost converter.

An embodiment provides a converter architecture compatible with the provision of a plurality of output voltages.

Thus, an embodiment provides a power converter comprising:
  a first branch and a second branch of at least two series-connected switches each, coupled in parallel between a first terminal and a second terminal and having the junction points of their switches coupled to two terminals of application of a first voltage;
  a third branch and a fourth branch of at least two series-connected switches each, coupled in parallel between a third terminal and a fourth terminal, and having the junction points of their switches coupled to two terminals for supplying a second voltage; and
  at least one first piezoelectric element coupling the first terminal to the third terminal,
  wherein the turning on of each switch is performed under an approximately zero voltage thereacross, the control of the switches being synchronized with respect to the current internal to the piezoelectric element.

According to an embodiment, the second and fourth terminals are interconnected.

According to an embodiment, at least one capacitive element couples the second terminal to the fourth terminal.

According to an embodiment, at least one second piezoelectric element couples the second terminal to the fourth terminal.

According to an embodiment, the switches are controlled to alternate phases at substantially constant voltage and at substantially constant between the terminals of the piezoelectric element(s).

According to an embodiment, the converter further comprises a circuit for controlling, in all or nothing, all or part of the switches.

According to an embodiment, said circuit is capable of detecting at least one of the times of zero crossing of the motional current of the piezoelectric element(s), and of generating a signal for controlling at least one of the switches according to the detected zero crossing time.

According to an embodiment, the detection of the zero crossing of the current is performed by a measurement and a comparison with zero of the current flowing through the piezoelectric element(s) during a phase at constant voltage, or by a measurement and a comparison with zero of the derivative of the voltage across the piezoelectric element(s) during a phase at constant charge, or by a measurement of the deformation of the piezoelectric element(s) and a deduction of the deformation limiting value crossing time.

According to an embodiment, the switches are cyclically controlled at an approximately constant, preferably constant, frequency, the alternation of the phases at substantially constant voltage and at substantially constant charge across the piezoelectric element(s) being applied for each resonance period of the piezoelectric element.

According to an embodiment, the sum of the charges exchanged by the piezoelectric element(s) over a resonance period is substantially zero.

According to an embodiment, the converter comprises:
  at least one first switch coupling the first terminal to a terminal of application of the first voltage;
  at least one second switch coupling a terminal for supplying the second voltage to the fourth terminal;
  at least one third switch coupling the third terminal to said terminal for supplying the second voltage;
  at least one fourth switch coupling the third terminal to the other terminal for supplying the second voltage;

at least one fifth switch coupling the first terminal to the other terminal of application of the first voltage;

at least one sixth switch coupling said other terminal of application of the first voltage to the second terminal;

at least one seventh switch coupling said terminal of application of the first voltage to the second terminal; and at least one eighth switch coupling said other terminal for supplying the second voltage to the fourth terminal.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
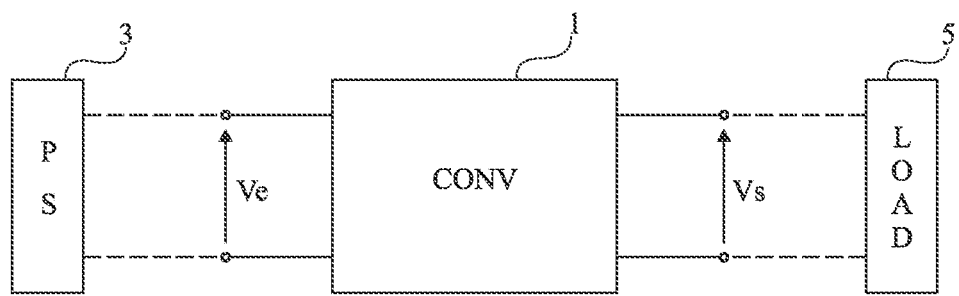
FIG. 1 is a simplified representation in the form of blocks of a system using a converter of the type to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the structure and the forming of the circuits upstream and downstream of the described converters have not been detailed either, the described embodiments being compatible with usual applications of such converters.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 is a simplified representation in the form of blocks of a system using a converter of the type to which the described embodiments apply.

A converter 1 (CONV) has the function of converting a first voltage or input voltage Ve, for example supplied by a power source 3 (PS), into a second voltage or output voltage Vs, intended to power a load or a battery 5 (LOAD). Most often, converter 1 also regulates the voltage Vs supplied to the load. Converter 1 may generally convert a DC voltage into a DC voltage (DC/DC) or into an AC voltage (DC/AC), or an AC voltage into a DC voltage (AC/DC) or into an AC voltage (AC/AC). According to the applications, such a conversion is performed in one or a plurality of successive stages. Power source 3 (PS) is for example a battery, a solar panel, the AC electrical network, etc. Converter 1 may, according to applications, raise or lower the voltage Ve supplied by power source 3.

In a converter 1 of switched-mode power supply type based on an inductive power storage element, the converter is generally controlled in pulse-width modulation to control the periods of power storage into the inductive element and of delivery of this power to the load. Such a control however cannot be transposed to a converter based on an element made of a piezoelectric material. Indeed, the control must on the one hand be at the resonance frequency of the piezoelectric and on the other hand be synchronized with respect to the internal current of the piezoelectric (linked to the deformation of the piezoelectric). Indeed, on connection of the source, the internal current of the piezoelectric should have a certain sign so that the product of the input voltage by the input current results in a power input to the piezoelectric. Conversely, the internal current of the piezoelectric should have a certain sign so that the product of the output voltage by the output current results in a power decrease at the level of the piezoelectric for the output. Now, the internal current is substantially sinusoidal and at the resonance frequency of the piezoelectric. Generally, a piezoelectric has a capacitive behavior (the application of a DC voltage does not result in the appearing of a current) while an inductance submitted to a DC voltage results in a theoretically infinite growth of its current. Such a difference results in that the laws of control of the inductive elements are not adapted to the driving of piezoelectric converters.

It would however be desirable to take advantage of the input voltage cut-off and power storage principles and to use them with a piezoelectric material to benefit from the advantages of piezoelectric materials, particularly in terms of low losses and of low bulk.

The solution described by document KR-A-20100137913 cannot be transposed either, since this solution provides regulating the output voltage by adjusting the switching frequency, which results in diverging from the resonance frequency of the piezoelectric material, and generates a decrease of the quality factor and of the efficiency. Now, a piezoelectric material is precisely preferred to an inductance to take advantage of a better quality factor. Accordingly, such a solution is in practice limited to applications where the load power varies little and to a factor two between the input voltage and the output voltage, otherwise the number of piezoelectric transducers should be multiplied, which then adversely affects the low bulk which, here again, is one of the advantages of a piezoelectric material over a magnetic material.

Solutions based on a variation of the capacitance of an electromechanical element (such as described in article "Microresonant devices for power conversion" J. Mark Noworolski and Seth R. Sanders, Proceedings Volume 3514, Micromachined Devices and Components IV; 1998) to perform a power conversion of electrostatic nature are also unable to be transposed to piezoelectric elements. Indeed, in the electrostatic case, if no charge is stored on the variable-capacitance structure, no voltage is delivered, even if a capacitance variation occurs. The electrostatic structure should then be polarized and, in the case where the polarization charge is removed, a new one should be placed back, which introduces losses (in particular, a switching at the voltage zero is not possible). Further, the mechanical motion and thus the capacitance variation cannot result in an inversion of the sign of the stored charge or of the stored voltage, which discards any possibility of using voltages of opposite sign during the cycle. Further, not all the cycles described in the present disclosure operate with an electrostatic structure, since the voltage across the piezoelectric element always transits through the 0 value and sometimes even becomes negative.

The described embodiments originate from an analysis of the operation of a piezoelectric material at the resonance to use charge transfer phases enabling not only to do away with the use of an inductive element, but also to regulate the output voltage while keeping the resonance of the piezoelectric material, that is, with switching cycles at a frequency which corresponds to the resonance frequency of the piezoelectric, where the durations of the respective switching phases within the cycle are adjusted.

More particularly, the mechanical oscillation of a piezoelectric element is approximately sinusoidal. An increase or a decrease in the power stored over a period respectively results in an increase or in a decrease of the oscillation amplitude. Further, in open circuit (at constant charge), an increase in the oscillation amplitude generates an increase of the amplitude of the off-load voltage across the piezoelectric element while, at constant voltage, the oscillation amplitude increase results in a current increase.

According to the described embodiments, it is provided to alternate phases at substantially constant voltage and at substantially constant charge across the piezoelectric element, within periods of substantially constant duration corresponding to the resonance frequency or natural frequency of the piezoelectric element.

The described embodiments are based on a specific converter architecture where a piezoelectric element is placed in the branch of a switch bridge.

A difference with respect to transformer-type converters such as described in documents US-A-2107/012556, CN-B-101938220, and CN-A-102522492, where the terminals of a piezoelectric element are located on the input side while other terminals are located on the output side, the two terminals of the piezoelectric element of the described converter may be coupled to the input or to the output of the converter according to the switching phases. More particularly, in the mentioned documents, in practice, the piezoelectric transformer has four electrodes, two which are used for the power supply to the piezoelectric material from the input and two which are used to the power delivery at the output. In certain operating phases, the input and the output may be connected at the same time to the piezoelectric. In the described embodiments, there are no separated electrodes between the input and the output (there are no electrodes dedicated to the input and different electrodes dedicated to the output). There thus are no phases when the input and the output may be connected at the same time to the input and to the output (this would cause a short-circuit between the input and the output).

Figure 2:
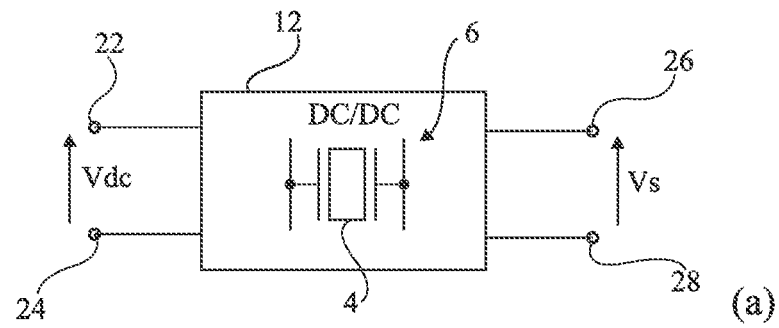
FIG. 2 very schematically shows in the form of blocks three embodiments of converters (views (a), (b), and (c))
Figure 2:
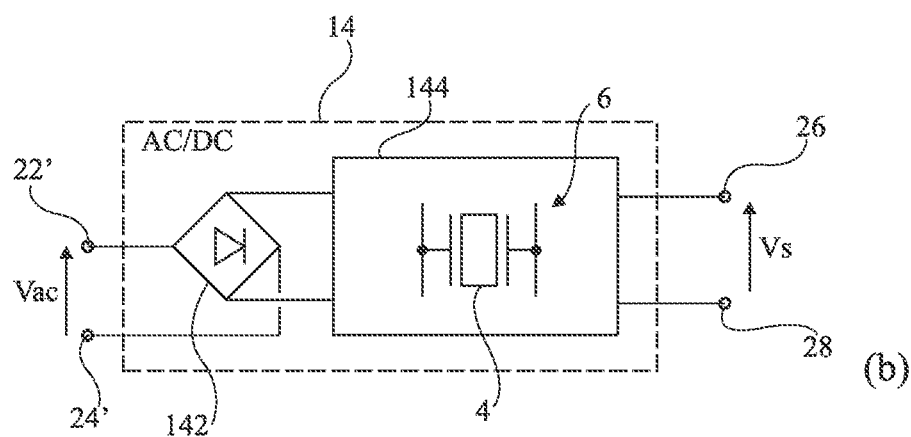
Figure 2:
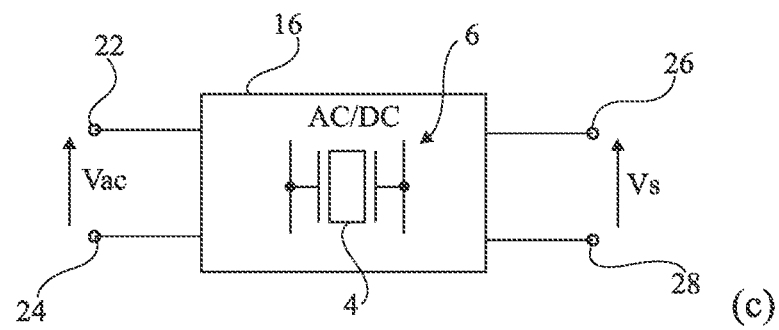

FIG. 2 very schematically shows in the form of blocks three embodiments of converters (views (a), (b), and (c)).

All these embodiments are based on the use of at least one piezoelectric element 4 assembled in a branch (in the horizontal bar in the orientation of the drawings) of an H-shaped bridge 6 of switches (not shown in FIG. 2).

View (a) of FIG. 2 shows the case of a DC/DC converter 12 converting a DC input voltage Vdc, applied between two input terminals 22 and 24 of converter 12, into an output DC voltage Vs, supplied between two output terminals 26 and 28 of converter 12.

View (b) of FIG. 2 shows the case of an AC/DC converter 14 converting an AC input voltage Vac, applied between two input terminals 22' and 24' of converter 14, into an output DC voltage Vs, supplied between two output terminals 26 and 28 of converter 14. In the example of view (b), it is assumed that converter 14 comprises a rectifying stage 142 (typically a rectifying bridge) of AC voltage Vac, associated with a DC/DC conversion stage 144. The DC/DC conversion stage 144 is typically a converter of the type of converter 12 of view (a) of FIG. 2.

View (c) of FIG. 2 shows another embodiment of an AC/DC converter 16 converting an AC input voltage Vac, applied between two input terminals 22 and 24 of converter 16, into an output DC voltage Vs, supplied between two output terminals 26 and 28 of converter 16. In the embodiment of FIG. 2(c), the switches of the bridge converter directly take part in rectifying the AC input voltage.

According to the described embodiments, a specific switching of the converter switches is provided so that during each resonance period of the piezoelectric material of element 4, phases at substantially constant voltage and phases at substantially constant charge are alternated. Phases at substantially constant voltage enable, in steady or permanent state, to switch from one constant voltage to another to turn on the switches which are meant to be when the voltage thereacross is substantially zero, preferably zero (switching said to be at the voltage zero).

Such switch phases enable, during a cycle of mechanical oscillation of the piezoelectric material, both to inject and to remove the same quantity of power, with no saturation of the amplitude of the oscillations (too much input power) and no dampening of the oscillations (too much consumed power). In the first case, the quality factor and the efficiency would be deteriorated. In the second case, the system would end up no longer operating.

Further, a specific control of the different switches is provided to respect, in steady state, the fact that over a cycle of deformation of the piezoelectric material, that is, over an oscillation period and seen from the piezoelectric element, the sum of the charges exchanged with the outside is zero and the sum of the powers exchanged with the outside is zero (to within losses).

More particularly, it is provided for the turning-on of each switch to be performed under an approximately zero voltage thereacross. This takes part in obtaining a power balance from the point of view of the piezoelectric element over a resonance period. Further, the switch control is preferably synchronized with respect to the internal current of the piezoelectric element. The synchronization is performed, for each resonance period, by detecting a zero crossing of the internal current of the piezoelectric element. The synchronization particularly enables to ensure that, during the power input phase, the current has the right sign and always the same sign to provide power to the piezoelectric and of opposite sign when power is delivered back at the output. Further, the synchronization enables, on the one hand, to maximize the power exchanged for given amplitude of the current internal to the piezoelectric and, on the other hand, to make sure that, during phases at constant charge, the voltage will effectively vary in the right direction to reach the next voltage stage and thus enable to turn on the next switch with a zero voltage thereacross. It should be noted that phases at constant charge are not simple dead time phases avoiding a risk of short-circuit by giving time to a first transistor to turn off before turning on another one, but phases when the piezoelectric voltage varies by itself from the previous voltage stage to the next voltage stage and this, without using switching-aid circuits for example formed of additional passive components (inductances/capacitors).

Figure 3:
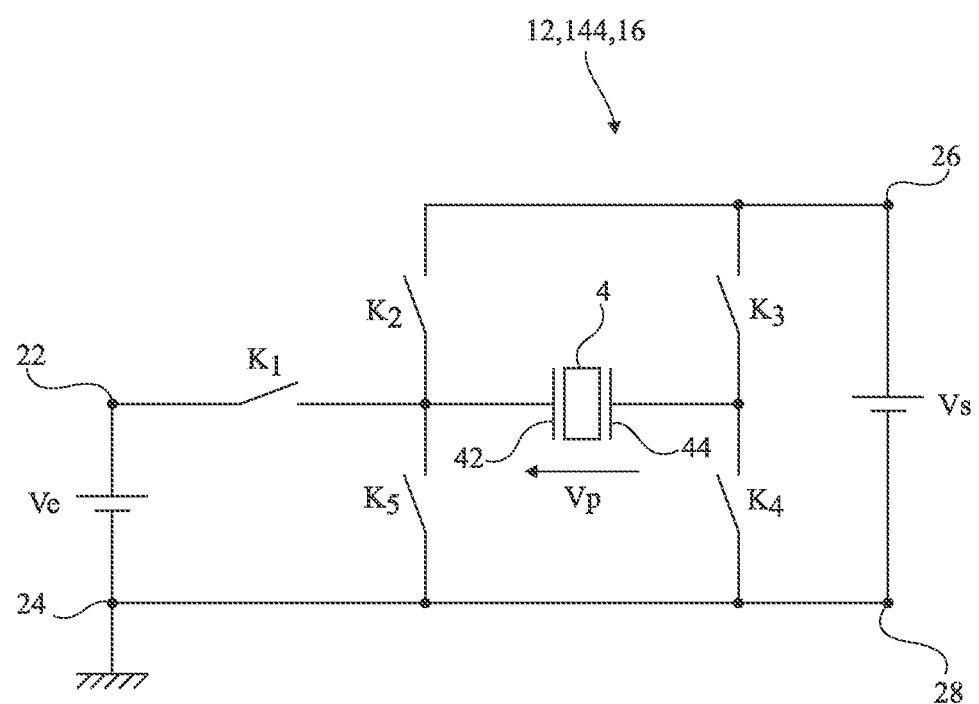
FIG. 3 schematically and generally shows an embodiment of an architecture of a DC/DC converter.

FIG. 3 schematically and generally shows an embodiment of a DC/DC converter architecture respected by converters 12, 144, and 16 of FIG. 2.

The architecture of FIG. 3 is compatible, according to the control signals applied to the switches, with a boost, buck, buck-boost, or event voltage inverter use.

The converter of FIG. 3 comprises:
a piezoelectric element 4;
a first switch K1 coupling, preferably connecting, a first electrode 42 of the piezoelectric element to a first terminal 22 of application of an input voltage Ve to be converted;
a second switch K2 coupling, preferably connecting, electrode 42 to a first terminal 26 for supplying an output voltage Vs;
a third switch K3 coupling, preferably connecting, a second electrode 44 of piezoelectric element 4 to the first terminal 26 for supplying voltage Vs;
a fourth switch K4 coupling, preferably connecting, electrode 44 to a second terminal 28 for supplying voltage Vs; and
a fifth switch K5 coupling, preferably connecting, electrode 42 to a second terminal 24 of application of voltage Ve.

The connection of switches K2, K3, K4, and K5 defines, with element 4, a bridge (schematized in the form of an H bridge), the ends of the branches of the bridge being interconnected. Such an assembly may also schematically define a diamond-shaped bridge with a switch in each side and piezoelectric element 4 in a diagonal of the diamond.

According to the embodiments and to the applications, the switches may be MOSFETs (Metal Oxide Semiconductor Field Effect Transistor), bipolar transistors, IGBTs (Insulated Gate Bipolar Transistor), diodes, transistors based on silicon, on GaN (Gallium Nitride), on SiC (silicon carbide), or on diamond, relays, microswitches, thyristors, etc. or a combination of switches of different natures.

The function of switch K1 is to control the phases when power is transferred from the power source (voltage Ve) to piezoelectric element 4. Switch K1 also enables to isolate the piezoelectric element from the input voltage. This is in particular what enables to couple, in certain switching phases, the two terminals of the piezoelectric element to the output.

The function of switches K3 and K4 is to control the phases when power is transferred from the piezoelectric element to the load (not shown in FIG. 3).

In the embodiment of FIG. 3, terminals 24 and 28 are confounded and define the reference of voltages Ve and Vs.

With a structure such as that shown in FIG. 3) the function (boost, buck, inverter) depends on the control applied to the switches.

According to an embodiment, all the switches are bidirectional for voltage and the assembly may then ensure all the functions.

According to another embodiment, where the converter is dedicated to a function, certain switches need not be bidirectional for voltage, or may even be replaced with diodes (or other intrinsic/automatic control switches according to the voltage thereacross).

Figure 4:
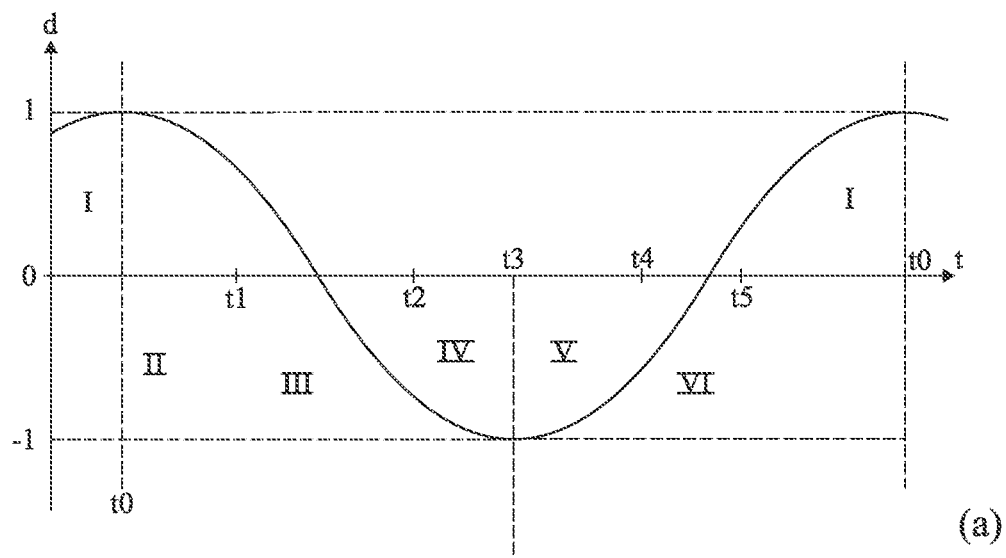
FIG. 4 illustrates, in simplified timing diagrams, an example of operation of the converter of FIG. 3 as a boost converter.
Figure 4:
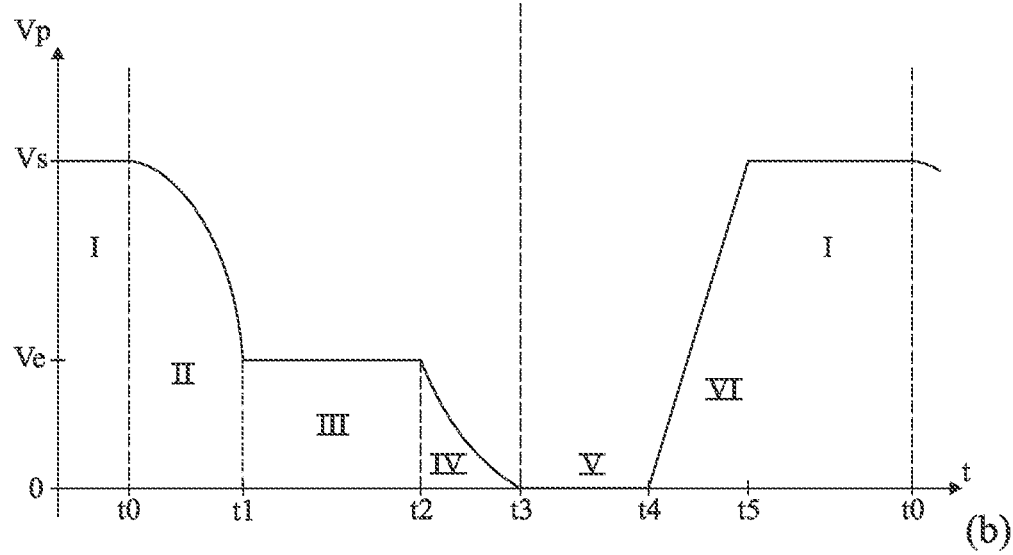

FIG. 4 illustrates in simplified timing diagrams an example of operation of the converter of FIG. 3 as a boost converter.

This drawing illustrates the operation in steady or permanent state, that is, from the time when the resonance of the piezoelectric material has been reached with a substantially constant amplitude, that is, with substantially balanced power and charge exchanges over each period. There thus is an identity (at least approximate) of the frequency of the control cycles with the resonance frequency of piezoelectric element 4. Thus, the converter operates at the resonance frequency of the piezoelectric element. To simplify the description, losses in the on switches and losses in the piezoelectric material at the resonance are neglected.

View (a) of FIG. 4 illustrates the mechanical deformation d of piezoelectric element 4 during a resonance cycle (period). The deformation scale is normalized.

View (b) of FIG. 4 illustrates a corresponding example of shape of voltage Vp (FIG. 3) across piezoelectric element 4.

In steady state, phases during which all the switches are off and phases during which at least two of the switches are on are alternated.

Voltage Vp across piezoelectric element 4 has three phases I, III, and V during which the voltage is stable and is respectively equal, in the example of FIG. 4, to Vs, Ve, and 0, and three phases II, IV, and VI of transition between the stable states.

The above-described operation is periodic, preferably at the resonance frequency of the piezoelectric element.

It is assumed that initially (phase I), switches K2 and K4 are on and all the other switches K1, K3, and K5 are off. Voltage Vp is then equal to voltage Vs.

At a time t0, where element 4 is at its maximum deformation amplitude d (1) in a direction (arbitrarily positive), corresponding to a time when the current in piezoelectric element 4 is zero, all the switches are turned off (in fact, switches K2 and K4, since the others are already off). The deformation of element 4 then decreases and, therewith, voltage Vp thereacross. One is in a phase (II) where it is operated at constant charge in piezoelectric element 4.

When (time t1) voltage Vp, in its decrease, reaches value Ve of the input voltage, switches K1 and K4 are turned on and the other switches remain off. There then is (phase III) a power transfer from the power source to element 4. Voltage Vp across element 4 is equal to input voltage Ve. The power transfer carries on until a time t2 when all the switches are turned back off (in practice, switches K1 and K4, since the other transistors are already off).

It is then proceeded (at time t2) to a phase IV where all the switches are off. This phase at constant charge carries on until a time t3 when element 4 reaches its maximum deformation d in the other direction (−1) with respect to the direction in which it has reached deformation (1). The derivative of the voltage across element 4 is zero at time t3.

At this time t3 when, in the example of FIG. 4, voltage Vp is equal or close to 0 and, more generally, corresponds to its minimum value (zero crossing of the derivative of the voltage), switches K2 and K3 are turned on (as a variation, switches K4 and K5 or all the switches of bridge 6) and a charge transfer occurs between the electrodes of piezoelectric element 4. This phase V which, in the example of FIGS. 3 and 4, is performed under a zero voltage, enables to preserve both the charge and power balance from the point of view of piezoelectric element 4 during a cycle.

At a time t4, switches K2 and K3 are turned off (as a variation, switches K4 and K5 or all the switches of bridge 6). This leads back to a phase VI where all the switches are off. The oscillation of element 4 carries on off-load until a time t5 when the voltage thereacross reaches again the value of output voltage Vs.

At this time t5, switches K2 and K4 are turned on and the power is transferred to the load. The transfer (phase I) carries on until the current in piezoelectric material 4 takes a zero value (time t0), which leads back to phase II where all the switches are turned off.

The signals for controlling the different switches are generated according to the voltage level and to the needs of the load. The regulation is performed by adjusting the times of occurrence of the different phases in a cycle. The different phases, and thus also the cycles, are synchronized, with respect to the internal current in the piezoelectric element, by the detection (time t0) of the coming down to zero of the internal current in the piezoelectric element.

The detection of time t1 is for example performed by a measurement of voltage Vp to turn on switches K1 and K4 when the voltage reaches value Ve. According to another embodiment, where the power or the current sampled by the load is measured or known, time t1 is determined by timing (for example, from the turning off of switch K2 and the timing periods previously calculated according to the output current).

The determination of time t2 is for example performed by timing in an operation where the output power/current is measured or known. According to another embodiment, this time is determined with respect to the previous cycle by advancing or delaying it according to whether, at the previous cycle, voltage Vp was zero or not at time t3 when the derivative of voltage Vp is zero. A regulation of proportional-integral type may for example be used.

The determination of time t3 may be performed by timing (for example, by using a time counter or timer). Indeed, time t3 corresponds to the half-period from time t0. One may also detect the negative-to-positive inversion of the derivative of voltage Vp, or also use a sensor of the deformation limits of the piezoelectric material.

Time t4, and thus the duration of phase V, conditions the quantity of charges which will be removed from the piezoelectric at the zero voltage, that is, with no power retrieval from the piezoelectric. The longer phase V, the less power is retrieved from the piezoelectric and the more a cycle with a positive power balance is favored. The more the power balance is positive, the more the deformation amplitude of the piezoelectric increases from one cycle to another and the higher the output power/current will end up being. Indeed, during phase I, the higher the current, the larger the quantity of charges transmitted to the output, all the more as the duration of phase I increases at the same time as the duration of phase V is increased (the increase of the deformation amplitude accelerates the voltage variation during phase VI and thus shortens the duration of phase VI, which in the end leaves more time available both for phase V and for phase I). The determination of time t4 is preferably performed by measuring output voltage Vs and by comparing it with a reference/set point value. The same type of control of time t4 may also be performed by regulating the output power or the output current.

Times t5 and t0 are for example automatic in the case of the use of a diode as a switch K2. As a variation, for time t5, one may measure the voltage across element 4 to detect when it reaches value Vs, or use a timer. For time t0, a detection of an inversion of the current direction, of a deformation limit of the piezoelectric material, a timer, etc. may be used.

Another difference between the described embodiments and the above-mentioned prior documents which operate as a transformer is that the power transfer occurs based on a voltage difference Ve−Vs between two DC voltages. In the described embodiments, the piezoelectric element does not receive an AC voltage.

Figure 5:
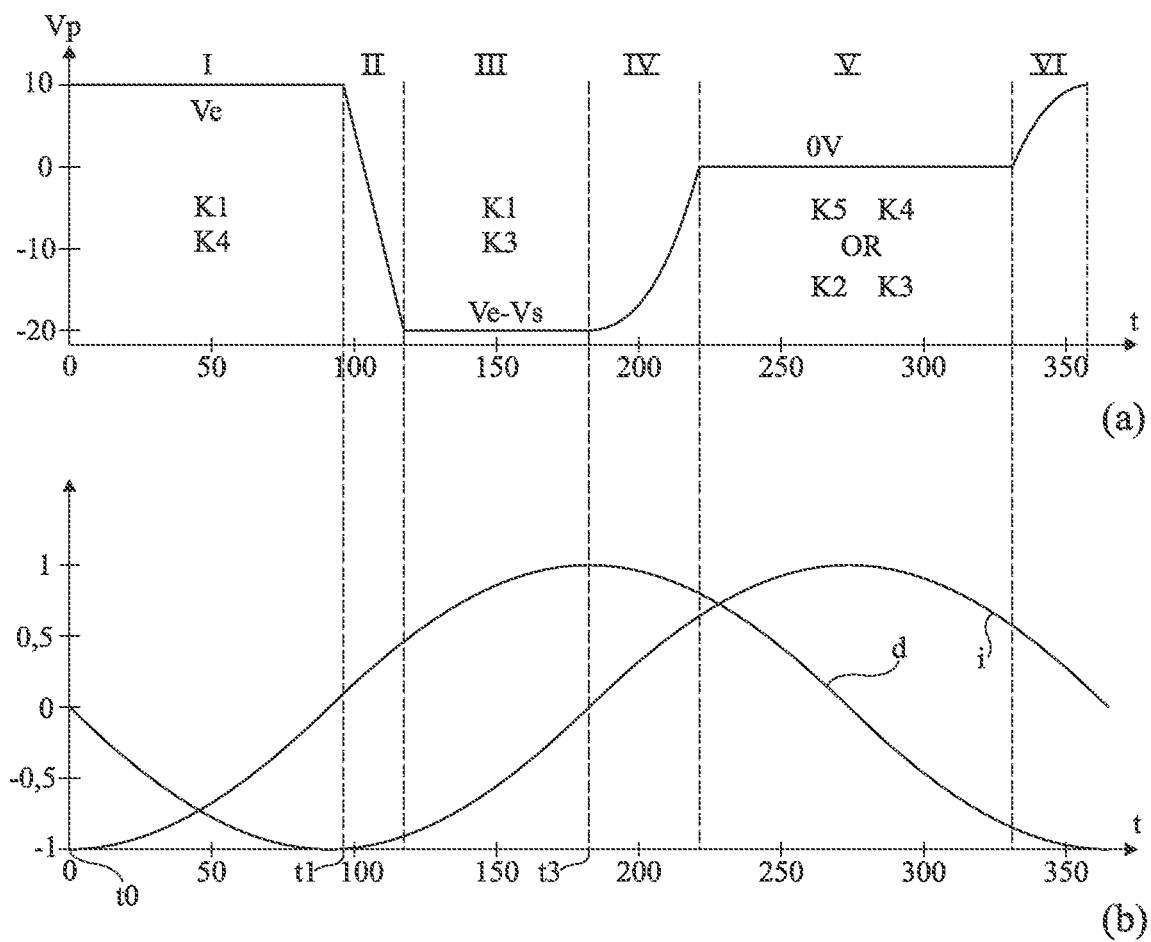
FIG. 5 illustrates, in timing diagrams, another example of operation of the converter of FIG. 3 as a boost converter.

FIG. 5 illustrates, in timing diagrams, another embodiment of the converter of FIG. 3 as a boost converter.

More particularly, FIG. 5 illustrates, in timing diagrams, another method of control of switches K1 to K5 of FIG. 3 to obtain a boost operation.

View (a) of FIG. 5 illustrates an example of shape of voltage Vp across piezoelectric element 4 during a resonance cycle (period). The scales of voltage Vp and of time t are arbitrary. A 10-volt voltage Ve and a desired 30-volt voltage Vs are assumed in the present example.

View (b) of FIG. 5 illustrates the mechanical deformation d of piezoelectric element 4 and the value of current i in piezoelectric element 4 if it was maintained at constant voltage. In practice, only portions of this current are exchanged with the outside, which portions correspond to the phases at constant voltage. The rest of the time, this current charges/discharges the parallel capacitor of the equivalent electrical model of the piezoelectric. This current i will be called motional current of the piezoelectric hereafter. The scales of deformation d and of current i are normalized.

The six operating phases I, II, III, IV, V, and VI illustrated in relation with FIG. 4 are present. However, the voltage stages here are at Ve, Ve−Vs, and 0.

As for the embodiment illustrated in FIG. 4, all the switches are off during phases II, IV, and VI when voltage Vp across piezoelectric element 4 varies. Similarly, phase V corresponds to the case where voltage Vp is zero and where switches K2 and K3 (as a variation, switches K4 and K5 or all the other switches of bridge 6) are turned on while the other switches are off. However, phase I where switches K1 and K4 are turned on corresponds to a state where voltage Vp is equal to input voltage Ve. Further, phase III corresponds to a phase where switches K1 and K3 are turned on (all the other switches being off) and where voltage Vp is equal to Ve−Vs, that is, a negative voltage since voltage Vs is greater than voltage Ve (boost mode).

In the cycle illustrated in FIG. 5, the maximum (1) of deformation d is at time t3 of switching from phase III to phase IV and the minimum (−1) of deformation d is at time t0 of switching from phase VI to phase I.

The motional current i of the piezoelectric has a sinusoidal shape of same period as deformation d.

Figure 6:
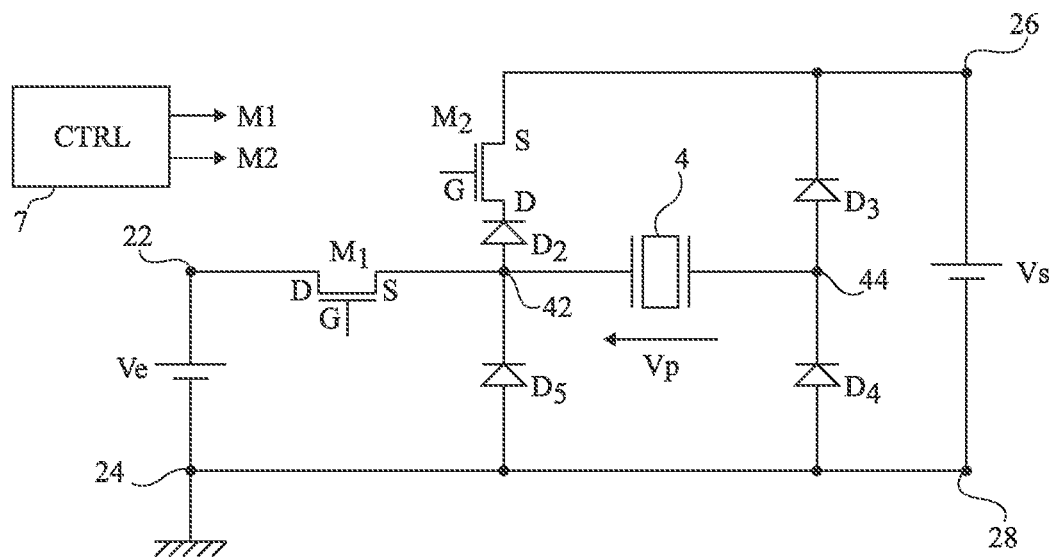
FIG. 6 schematically shows an embodiment of the circuit of FIG. 3, dedicated to an operation in buck mode.

FIG. 6 schematically shows an embodiment of the circuit of FIG. 3, dedicated to a buck operation.

According to this embodiment:

switch K1 is formed of a MOS transistor M1 having its drain D coupled, preferably connected, to terminal 22, having its source S coupled, preferably connected, to electrode 42 of element 4, and having its gate G receiving a signal (in all or nothing) for controlling a control signal generation circuit 7 (CTRL);

switch K2 is formed of a MOS transistor M2, series-connected with a diode D2, source S of transistor M2 being on the side of terminal 26, its gate G receiving a signal for controlling circuit 7, and the anode of diode D2 being on the side of electrode 42; and switches K3, K4, and K5 are respectively formed of diodes D3, D4, and D5, the anode of diodes D4 and D5 being coupled, preferably connected, to common terminals 24 and 28 and the cathode of diode D3 being coupled, preferably connected, to terminal 26.

The function of diode D2 is to ensure an automatic locking according to the potential difference between terminals 26 and 42 and thus ensure the bidirectionality for voltage of switch K2 while transistor M2 alone is not bidirectional.

It should be noted that a control circuit 7 delivering control signals in all or nothing to the different controllable switches is present in all the embodiments. This circuit delivers the control signals, preferably, according to information on the load side and/or on the power source side to ensure the provision of a regulated voltage Vs at a desired value. Circuit 7 does not necessarily provide a control signal to each switch. In particular, certain switches may, according to embodiments, be diodes or the like.

Figure 7:
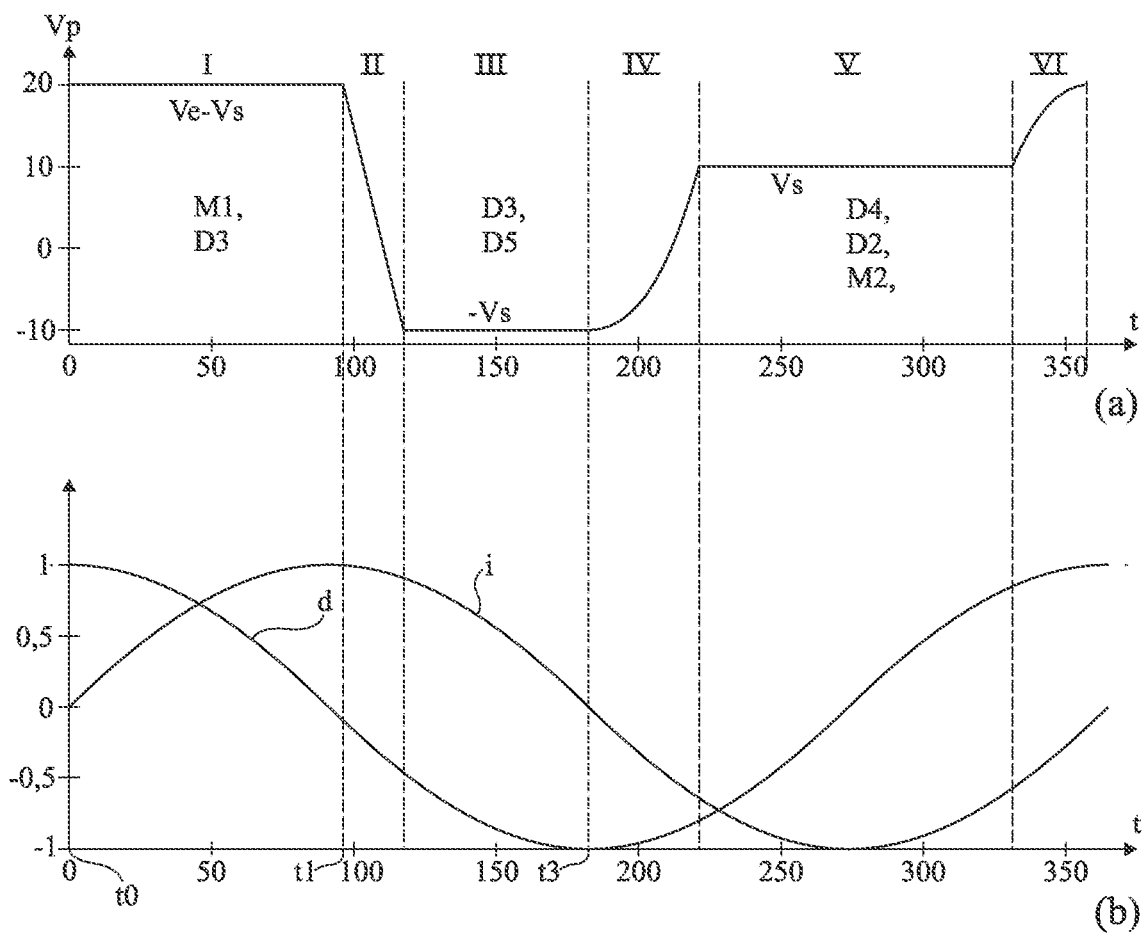
FIG. 7 illustrates in simplified timing diagrams an example of operation of the converter of FIG. 6 as a buck converter.

FIG. 7 illustrates, in simplified timing diagrams, an example of operation of the converter of FIG. 6 in buck mode.

View (a) of FIG. 7 illustrates an example of shape of voltage Vp across piezoelectric element 4 during a resonance cycle (period). The scales of voltage Vp and of time t are arbitrary. In the example of FIG. 7, a 30-volt input voltage Ve and a 10-volt desired output voltage Vs are assumed.

View (b) of FIG. 7 illustrates the mechanical deformation d of piezoelectric element 4 and the value of motional current i in piezoelectric element 4. The scales of deformation d and of motional current i are normalized over an oscillation period of the piezoelectric element.

The buck embodiment illustrated in FIGS. 6 and 7 requires for input voltage Ve to be at least twice greater than the desired output voltage Vs.

The switching sequence here again comprises six phases, among which three phases (II, IV, and VI) where voltage Vp is not stable, switches M1 and M2 being off, and diodes D2, D3, D4, and D5 being reverse biased.

Phases, I, III, and V, where voltage Vp is stable, respectively correspond to:

a phase I during which switch M1 is on and diode D3 is forward biased (switch M2 being off and diodes D4 and D5 being reverse biased), voltage Vp then being equal to Ve−Vs, corresponding to a maximum value;

a phase III when switches M1 and M2 remain off, but diodes D3 and D5 are forward biased (diode D4 being reverse biased), voltage Vp then is equal to −Vs, corresponding to a minimum value; and a phase V during which switch M2 is on and diodes D2 and D4 are forward biased (switch M1 being off and diodes D3 and D5 being reverse biased), voltage Vp then being equal to Vs, corresponding to an intermediate value.

In the cycle illustrated in FIG. 7, the maximum (1) of deformation d is at time t0 of switching from phase VI to phase I and the minimum (−1) of deformation d is at time t3 of switching from phase III to phase IV.

Motional current i has a sinusoidal shape of same period as deformation d. It crosses zero at times t0 (between phases VI and I) and t3 (between phases III and IV).

As a variation, diodes D2, D3, D4, D5 are replaced with switches, for example, MOS transistors, controlled in synchronous rectification, that is, according to the sign of the voltage and/or of the current thereacross to respect the desired operation.

According to another example, referring to the diagram of FIG. 3, a buck converter, operative for any DC voltage Ve greater than voltage Vs, can be obtained with the following control sequence of switches K1 to K5:

transition phases II, IV, and VI during which are switches are off;

a phase I (at maximum voltage Vp) where only switches K1 and K4 are on, voltage Vp then being equal to Ve;

a phase III (at intermediate voltage Vp) where only switches K2 and K4 are on, voltage Vp then being equal to Vs; and a phase V (at minimum voltage Vp) where only switches K3 and K5 are on, voltage Vp then being equal to −Vs.

As compared with the embodiments of FIGS. 4 and 5, piezoelectric element 4 is, in FIG. 7 or according to the above control sequence, never short-circuited, that is, there is no stable phase where the voltage thereacross is zero.

Figure 8:
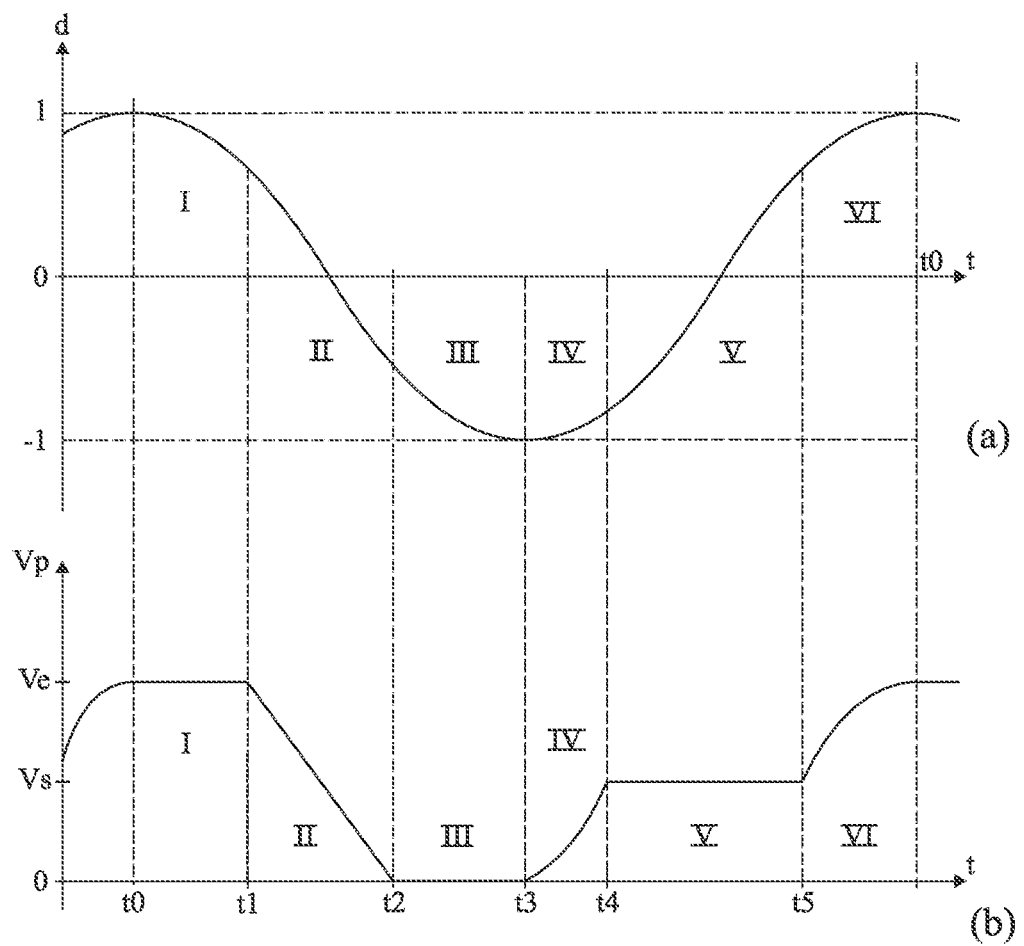
FIG. 8 illustrates in simplified timing diagrams another embodiment of a buck converter based on the assembly of FIG. 3.

FIG. 8 illustrates in simplified timing diagrams another embodiment of a buck converter based on the assembly of FIG. 3.

More particularly, FIG. 8 illustrates a case where a stable phase at a zero voltage Vp across element 4 is provided.

View (a) of FIG. 8 illustrates an example of mechanical deformation d of piezoelectric element 4. The scale of deformation d is normalized over an oscillation period of the piezoelectric element.

View (b) of FIG. 8 illustrates the corresponding shape of voltage Vp across piezoelectric element 4 during a resonance cycle (period). The scales of voltage Vp and of time t are arbitrary.

In the embodiment of FIG. 8, in addition to the three transition phases II, IV, and VI, one has:

a phase I (at maximum voltage Vp) where only switches K1 and K4 are on, voltage Vp then being equal to Ve;

a phase III (at minimum voltage Vp) where only switches K2 and K3 (and/or switches K4 and K5) are on, voltage Vp then being equal to 0; and a phase V (at intermediate voltage Vp) where only switches K2 and K4 are on, voltage Vp then being equal to Vs.

In the example of FIG. 8, the regulation is performed by adjusting the duration of phase I.

The determination of the different switching times may use the same techniques as those described hereabove for a boost converter, for example, a timer, a measurement of the output voltage of the voltage across element 4, a detection of the inversion of the current direction, of the deformation direction, etc.

The assembly of FIG. 3 may also be controlled to operate as a voltage inverter with a voltage Vs having a sign opposite to that of voltage Ve (keeping the reference level as being that of terminals 24 and 28).

According to an embodiment, applicable for a negative input voltage Ve, having an absolute value greater than the desired positive voltage Vs, in addition to the three transition phases II, IV, and VI where all switches are off, one has:

a phase I (at maximum voltage Vp) where only switches K2 and K4 are on, voltage Vp then being equal to Vs;

a phase III (at minimum voltage Vp) where switches K1 and K4 are on, voltage Vp then being equal to Ve; and a phase V (at intermediate voltage Vp) where switches K3 and K5 are on, voltage Vp then being equal to −Vs.

Figure 9:
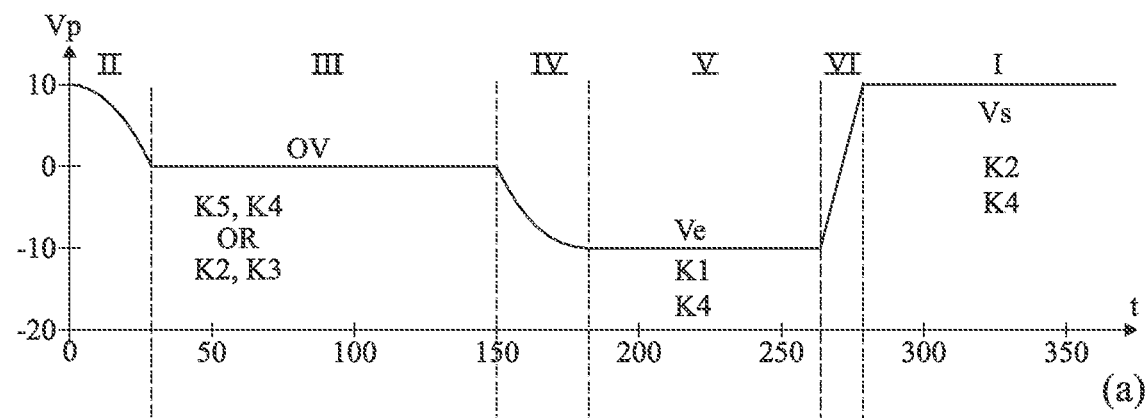
FIG. 9 illustrates, in simplified timing diagrams, an embodiment of a converter for inverting a negative voltage into a positive voltage, based on the assembly of FIG. 3.
Figure 9:
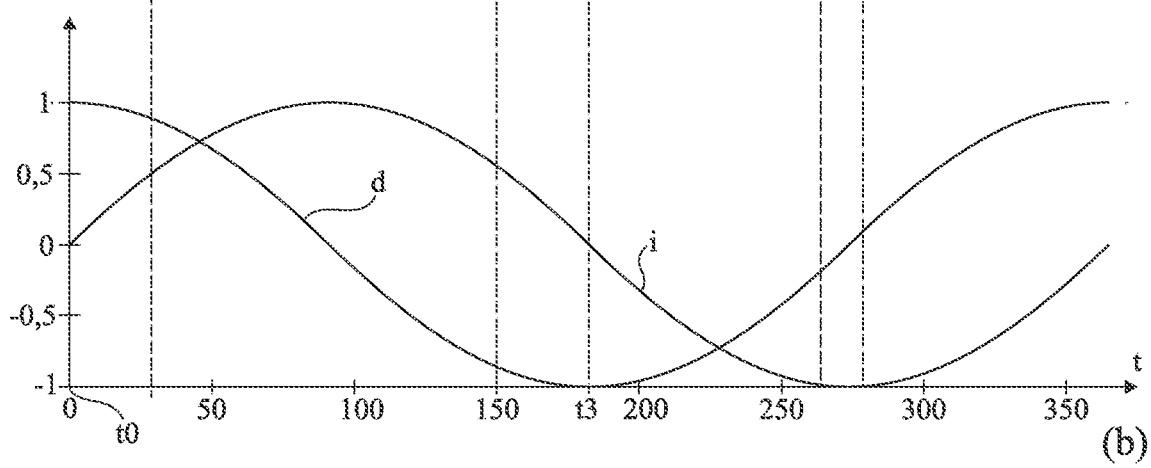

FIG. 9 illustrates, in simplified timing diagrams, another embodiment of a converter for inverting a negative voltage Ve into a positive voltage Vs, based on the assembly of FIG. 3.

View (a) of FIG. 9 illustrates an example of shape of voltage Vp across piezoelectric element 4 during a resonance cycle (period). The scales of voltage Vp and of time t are arbitrary. In the example of FIG. 9, a −10-volt input voltage Ve and a 10-volt desired output voltage Vs are assumed.

View (b) of FIG. 7 illustrates the mechanical deformation d of piezoelectric element 4 and the value of motional current i in piezoelectric element 4. The scales of deformation d and of motional current i are normalized over an oscillation period of the piezoelectric element.

In addition to the three transition phases II, IV, and VI where all the switches are off, one has:

a phase I where only switches K2 and K4 are on, voltage Vp then being equal to Vs;

a phase III where switches K2 and K5 (and/or switches K2 and K3) are on, voltage Vp then being equal to 0; and a phase V where switches K1 and K4 are on, voltage Vp then being equal to Ve.

In the cycle illustrated in FIG. 9, the maximum (1) of deformation d is at time t0 of switching from phase I to phase II and the minimum (−1) of deformation d is at time t3 of switching from phase IV to phase V.

Motional current i has a sinusoidal shape of same period as deformation d. It crosses zero at times t0 (between phases I and II) and t3 (between phases IV and V).

The architecture described in relation with FIG. 3 may also be used to perform an AC/DC conversion.

According to an embodiment, where the resonance frequency of piezoelectric element 4 is greater, preferably by a ratio of at least 50, than the frequency of the AC input voltage, it can be considered that the AC input voltage is substantially constant over one or a few resonance periods of the piezoelectric element. The system then operates as if there was a time succession of DC/DC conversions with an input voltage which varies slowly. The switches are controlled to respect, for each period of the resonance of the piezoelectric element, the charge balance, the power balance, and the switchings at the voltage zero. The duration of the phases of the cycle and the control of the switches thus dynamically adapt to the variation of the value of the sinusoidal input voltage.

Figure 10:
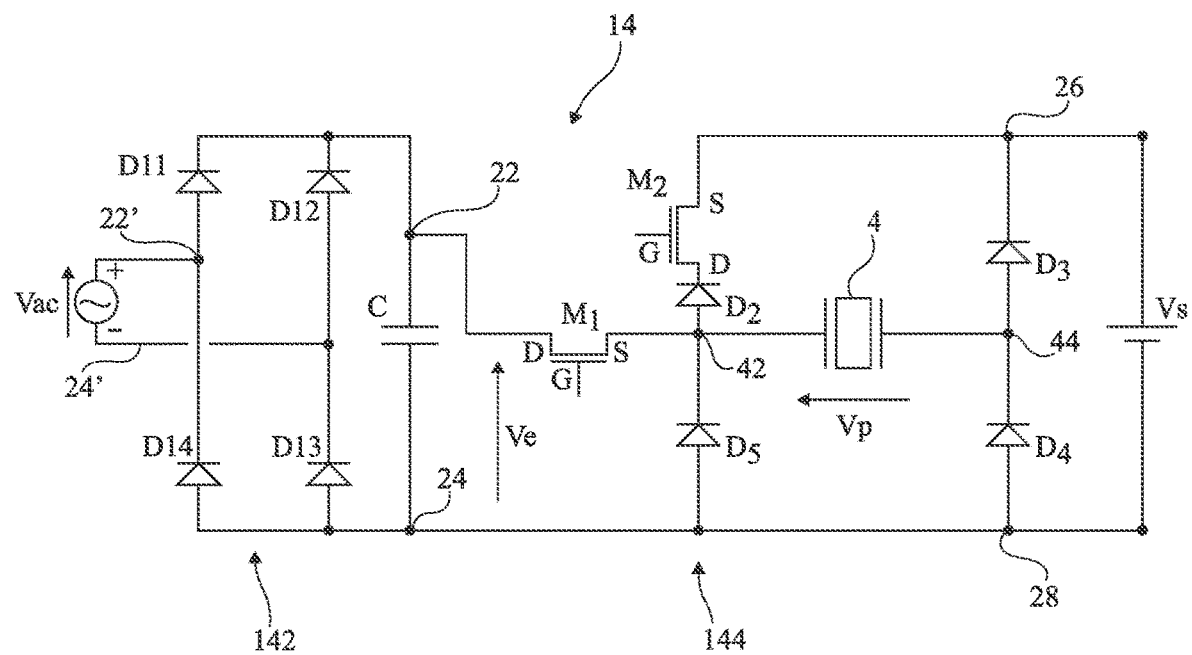
FIG. 10 schematically shows an embodiment of an AC/DC converter respecting the architecture of FIG. 3.

FIG. 10 schematically shows an embodiment of an AC/DC converter respecting the architecture of FIG. 3.

In the embodiment of FIG. 10, the AC/DC converter is of the type of converter 14 of view (b) of FIG. 2, that is, it comprises a rectifying stage 142 and a DC/DC conversion stage 144.

Rectifying stage 142 is for example a rectifier comprising diodes D11, D12, D13, and D14, having two AC input terminals coupled, preferably connected, to terminals 22' and 24' of application of AC voltage Vac and having two rectified output terminals coupled, preferably connected, to input terminals 22 and 24 of conversion stage 144. A capacitor C couples, preferably connects, terminals 22 and 24 to filter the rectified voltage before the conversion. Diodes D11 and D14 are in series between terminals 22 and 24, their junction point being coupled, preferably connected, to terminal 22', the anode of diode D11 and the cathode of diode D14 being on the side of terminal 22'. Diodes D12 and D13 are series-connected between terminals 22 and 24, their junction point being coupled, preferably connected, to terminal 24', the anode of diode D12 and the cathode of diode D13 being on the side of terminal 24'.

Conversion stage 144 has, in this example, the same structure as converter 12 of FIG. 6.

In this embodiment, the cyclic control is performed as long as rectified voltage Ve is greater than twice the value desired for voltage Vs. Outside of these periods, advantage is taken from the fact that a piezoelectric element has a high quality factor (generally greater than 1000). Thus, when the absolute value of voltage Ve becomes smaller than twice the value desired for voltage Vs, the converter may keep on supplying voltage Vs at the desired level and with the desired power due to the mechanical energy stored in the piezoelectric element.

Figure 11:
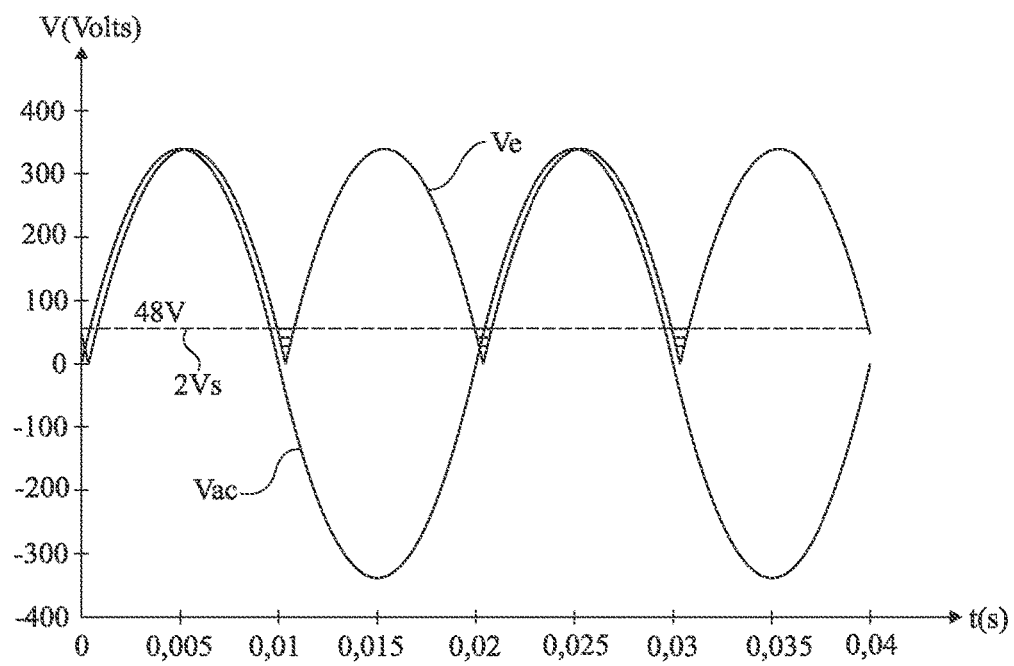
FIG. 11 illustrates, in timing diagrams, a practical example of operation of the converter of FIG. 10.

FIG. 11 illustrates, in timing diagrams, a practical example of operation of the converter of FIG. 10.

This drawing shows an example of shapes of AC input voltage Vac, the corresponding shape of input voltage Ve of conversion stage 144 (rectified voltage Vac) and, in dotted lines, twice (2Vs) the desired DC voltage Vs. The practical case of a voltage Vac corresponding to the mains (approximately 230 volts, 50-60 Hertz) is considered.

In many applications, voltage Vs is at most of a few tens of volts (24 volts in the example of FIG. 11). FIG. 11 then shows that the peak-to-peak amplitude of voltage Vac is sufficiently large (ratio of at least approximately 10) with respect to the desired voltage Vs for the periods during which conversion stage 144 receives no power (Ve<2Vs) to be negligible (in the order of 10% of the time). Such periods correspond to the hatched portions in FIG. 11.

Figure 12:
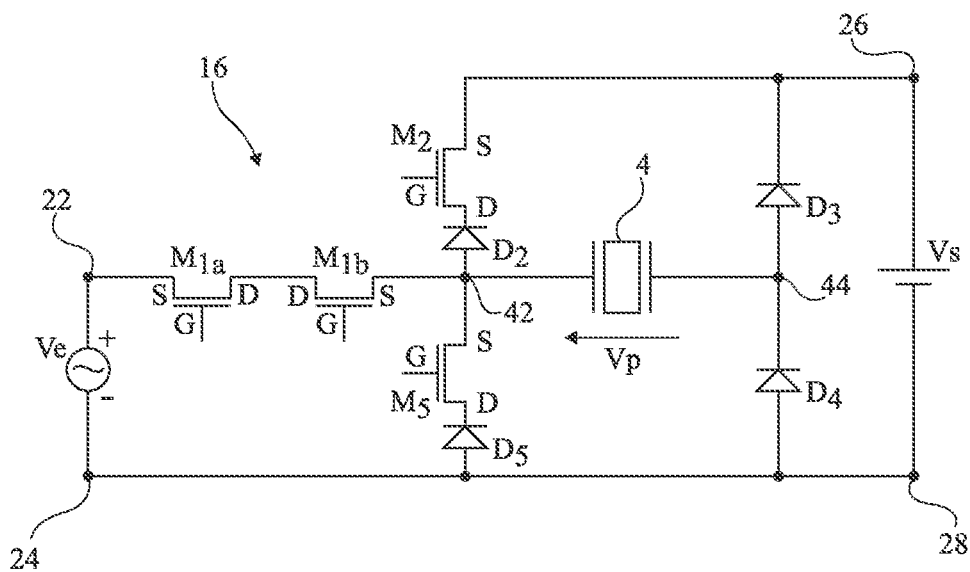
FIG. 12 shows another embodiment of an AC/DC converter respecting the architecture of FIG. 3.

FIG. 12 shows another embodiment of an AC/DC conversion respecting the architecture of FIG. 3.

The embodiment of FIG. 12 corresponds to the embodiment of a converter 16 (view (c) of FIG. 2) where switch bridge 6 is controlled to rectify the AC voltage, that is, which accepts negative values of input voltage Ve.

The structure of converter 16 shows the elements of converter 12 of FIG. 6, with the difference that a transistor M5 is added in series with diode D5 between terminals 28 and 42 to obtain a switch K5 bidirectional for voltage (withstanding positive and negative voltages) and that transistor M1 of FIG. 6 is replaced with two MOS transistors M1a and M1b in series, assembled head-to-tail, to ensure the function of a switch K1 bidirectional for voltage.

In the example of FIG. 12, the source of transistor M5 is on the side of terminal 42 and the sources S of transistor M1a and M1b are respectively on the side of terminal 22 and on the side of terminal 42. Transistors M1a and M1b thus have a common drain D. As a variation, transistors M1a and M1b have a common source.

The control cycle applied to the transistor control depends on the value of input voltage Ve.

When voltage Ve is (positive and) greater than 2Vs, the control cycle illustrated in FIG. 7 is applied, transistors M1a and M1b being on during phase I, transistor M5 being on during phase III, and transistor M2 being on during phase V. Voltage Ve may be considered as stable at the scale of a deformation period of the piezoelectric element, which is short (ratio of at least 100) as compared with the period of voltage Ve.

Figure 13:
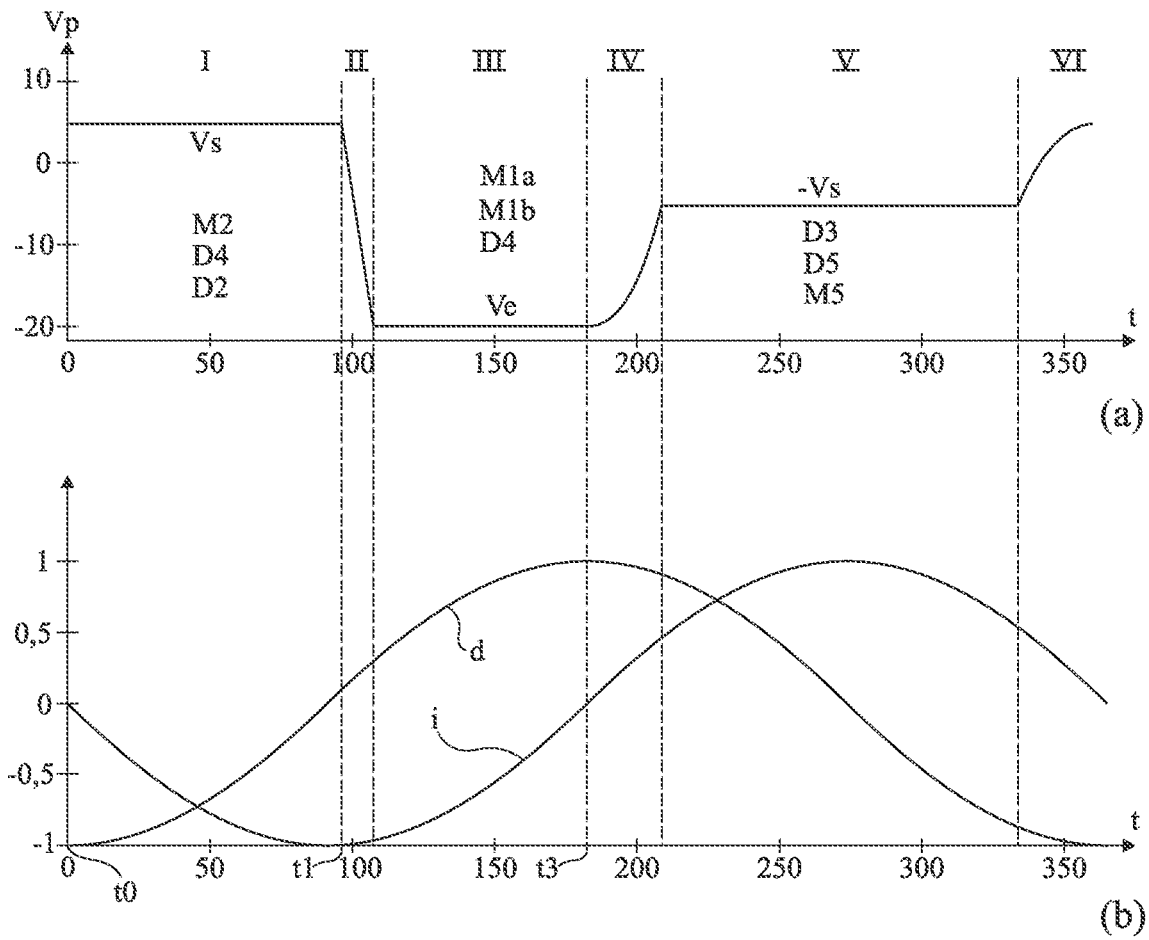
FIG. 13 illustrates, in timing diagrams, an embodiment of the switches of the converter of FIG. 12 when the input voltage is negative.

When voltage Ve is (negative and) smaller than −Vs, a control cycle such as shown in FIG. 13 hereafter is applied.

FIG. 13 illustrates, in timing diagrams, an embodiment of the switches of the converter of FIG. 12.

More particularly, FIG. 13 illustrates an example of control of transistors M1a, M1b, M2, and M5 to obtain an operation as a (buck) DC/DC converter when the input voltage is negative and smaller than the opposite of the desired output voltage.

View (a) of FIG. 13 illustrates an example of shape of voltage Vp across piezoelectric element 4 during a resonance cycle (period). The scales of voltage Vp and of time t are arbitrary. The example of FIG. 13 assumes a 5-volt voltage Vs and a voltage Ve which is substantially stable, for example, at the −20-volt level, during the considered deformation period.

View (b) of FIG. 13 illustrates the mechanical deformation d of piezoelectric element 4 and the value of motional current i in piezoelectric element 4. The scales of deformation d and of motional current i are normalized.

The six operating phases I, II, III, IV, V, and VI illustrated in relation with FIG. 7 are present. However, the voltage stages here are at Vs (maximum), Ve (minimum), and −Vs (intermediate).

Phases, I, III, and V, where voltage Vp is stable, respectively correspond to:
  a phase I during which switch M2 is on and diodes D2 and D4 are forward biased (switches M1a, M1b, and M5 being off and diode D3 being reverse biased), voltage Vp then being equal to Vs;
  a phase III during which switches M1a and M1b are on and diode D4 is forward biased (switches M2 and M5 being off and diode D3 being reverse biased), voltage Vp then being equal to Ve; and
  a phase V during which switch M5 is on and diodes D3 and D5 are forward biased (switches M1a, M1b, and M2 being off and diode D4 being reverse biased), voltage Vp then being equal to −Vs.

In the cycle illustrated in FIG. 13, the maximum (1) of deformation d is at time t3 of switching from phase III to phase IV and the minimum (−1) of deformation d is at time t0 of switching from phase VI to phase I.

Motional current i has a sinusoidal shape of same period as deformation d. It crosses zero at times t0 (between phases VI and I) and t3 (between phases III and IV).

Figure 14:
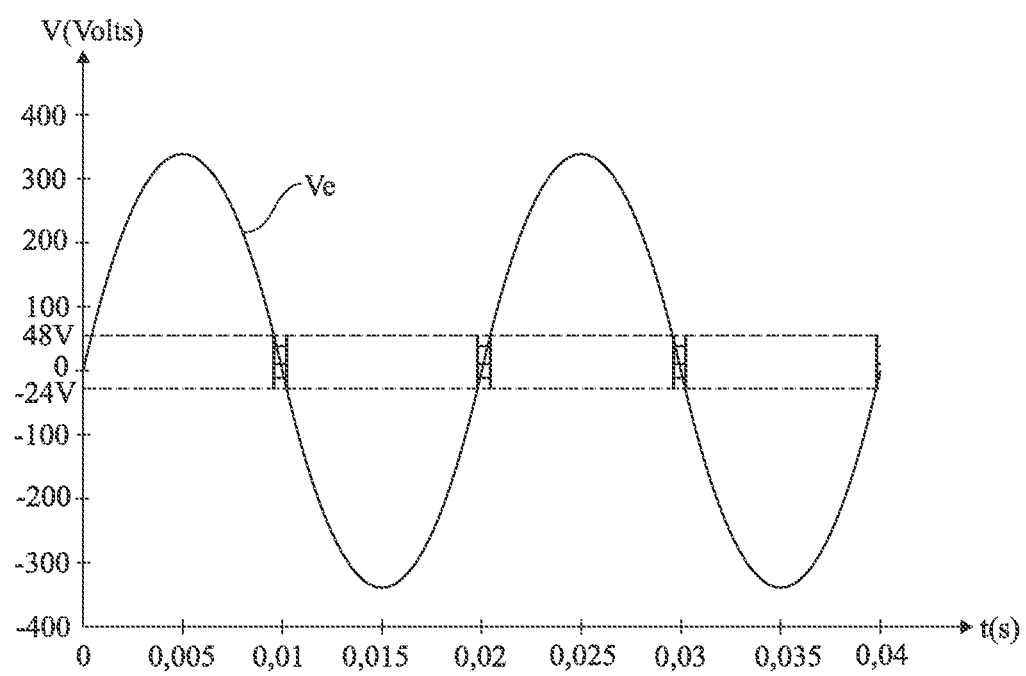
FIG. 14 illustrates, in a timing diagram, a practical example of operation of the converter of FIG. 12.

FIG. 14 illustrates, in a timing diagram, the operation of converter 16 of FIG. 12, at the scale of the frequency of AC voltage Ve of the mains.

Assuming a desired output voltage Vs in the order of 24 volts, the converter is not sufficiently powered between 48 volts and −24 volts to guarantee a power balance from the point of view of the piezoelectric element over a resonance period. However, piezoelectric element 4 has previously stored power and keeps on resonating with a decreasing amplitude (negative power balance over a resonance period) enabling to maintain part of the power exchanges (hatched areas in FIG. 14). During positive halfwaves and for a voltage Ve greater than 48 volts (2Vs), the converter operates (is controlled) according to the cycle of FIG. 7. During negative halfwaves and for a voltage Ve smaller than −24 volts (−Vs), the converter operates (is controlled) according to the cycle of FIG. 13.

Figure 15:
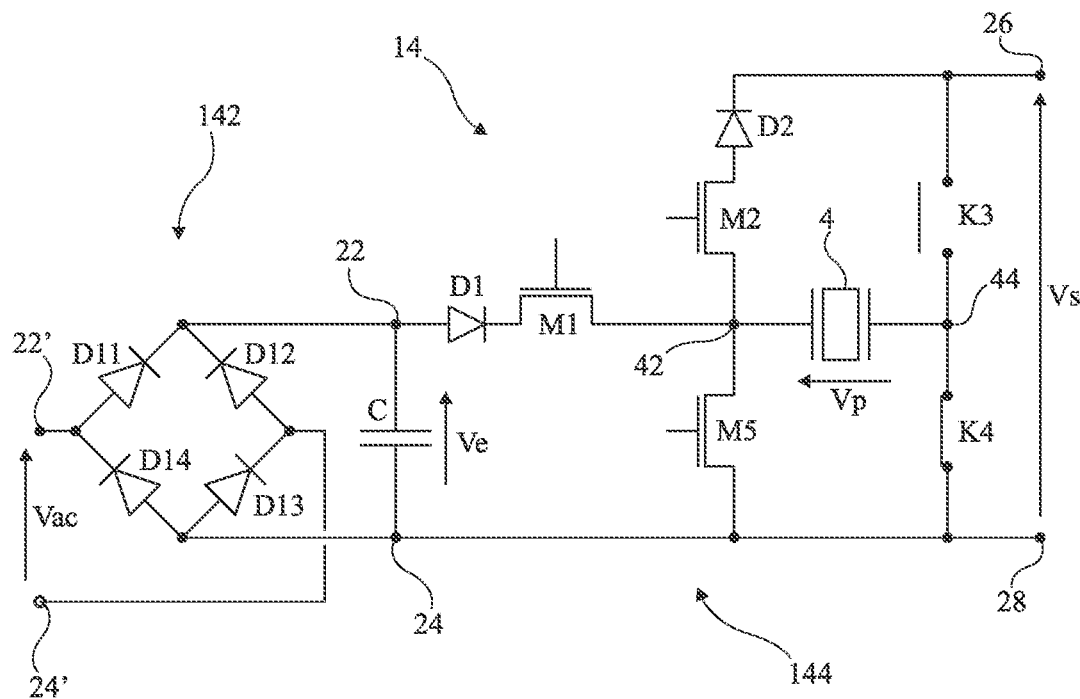
FIG. 15 shows another embodiment of an AC/DC converter.

FIG. 15 shows another embodiment of an AC/DC converter 14 based on the embodiment of view (b) of FIG. 2, that is, with a rectifying stage 142 and a conversion stage 144.

Bridge 142 is similar to that illustrated in FIG. 10.

On the side of the conversion stage, a specificity of the embodiment of FIG. 15 is that it is provided for switch K3 to be permanently off and for switch K4 to be permanently on. This may be obtained by controlling switches of an architecture such as shown in FIG. 3 or by assembly (direct connection of terminal 44 to terminal 28) and by replacing switch K3 with an open circuit. Thus, it can be considered that switch K5, for example, a MOS transistor M5, is in parallel with element 4 and may force a zero voltage between its terminals 42 and 44. In this example of FIG. 15, switch M2 is formed of a MOS transistor M2 in series with a diode D2 and switch K1 is formed of a switch M1 in series with a diode D1.

The control of transistors M1, M2, and M5 is performed according to a different cycle, according to whether voltage Ve between terminals 22 and 24 (rectified and filtered voltage) is greater or smaller than the desired output voltage Vs.

When voltage Ve is greater than voltage Vs, the switches are controlled in buck mode according to the cycle illustrated in FIG. 8. In other words:
  during phases II, IV, and VI, transistors M1, M3, and M5 are all off;
  during phase I, only switch K1 is on (switch K4 being a direct connection), voltage Vp then being equal to Ve;
  during phase III, only switch K5 is on (switch K4 being a direct connection), voltage Vp then being equal to 0;
  during phase V, only switch K2 is on (switch K4 being a direct connection), voltage Vp then being equal to Vs.

When voltage Ve is smaller than voltage Vs, the switches are controlled in boost mode according to the cycle illustrated in FIG. 4. In other words:
  during phases II, IV, and VI, transistors M1, M3, and M5 are all off;
  during phase I, only switch K2 is on (switch K4 being a direct connection), voltage Vp then being equal to Vs;
  during phase III, only switch K1 is on (switch K4 being a direct connection), voltage Vp then being equal to Ve;
  during phase V, only switch K5 is on (switch K4 being a direct connection), voltage Vp then being equal to 0.

Figure 16:
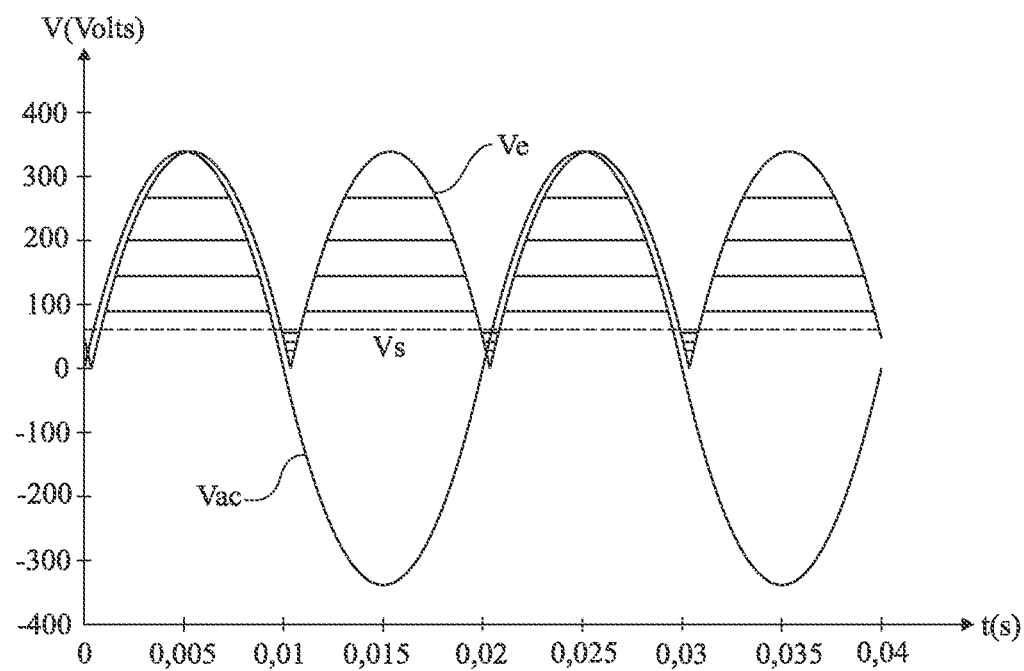
FIG. 16 illustrates in timing diagrams the operation of the converter of FIG. 15.

FIG. 16 illustrates, in a timing diagram, the operation of converter 14 of FIG. 15, at the scale of the frequency of the AC mains voltage.

FIG. 16 shows an example of shape of sinusoidal voltage Vac and the corresponding shape of rectified voltage Ve.

Horizontal hatchings indicate the respective periods during which the control is performed according to the cycle of FIG. 8 (voltage Ve greater than Vs) and according to the cycle of FIG. 4 (voltage Ve smaller than Vs).

It can be considered that, for AC/DC embodiments, a sinusoidal input voltage of amplitude Vac, having a low frequency with respect to the resonance frequency of piezoelectric element 4, is converted into a DC output voltage having a value smaller or greater than the value of voltage Vac according to the considered time in the period of the input voltage. A conversion cycle is then applied according to the principles of a DC/DC converter (charge balance, power balance and zero voltage switchings) at each resonance period of the piezoelectric, considering input voltage Ve as substantially constant over a piezoelectric resonance period. The rectifying bridge is optional but enables to simplify the forming of certain switches which then do not all have to be bidirectional for voltage.

The determination of the switching times depends on the application and on the desired conversion type (DC/DC, AC/DC, buck, boost, inverter). For example, for a system where the output current or power is known, the use of delays enables to avoid measurements. According to another example, certain voltage levels are measured and compared with thresholds and/or the deformation of the piezoelectric element (sensors of limiting values).

Generally, the duration of phase III conditions the quantity of charges which will be removed from the piezoelectric at minimum voltage. The longer phase III, the less power is retrieved from the piezoelectric and the more a cycle with a positive power balance is favored. The more positive the power balance, the more the deformation amplitude of the piezoelectric increases from one cycle to another and the higher the output power/current will end up being.

To trigger the system (transient state), only certain switches are turned on, particularly in boost mode, until the amplitude of the mechanical oscillations of the piezoelectric element is sufficient to perform the conversion cycle. In boost mode, it may also be proceeded to the six operating phase as soon as voltage Vp is greater than voltage Ve. The end of the transient state occurs when output voltage Vs substantially reaches the desired value. The determination of transient state switchings depends on the selected operating mode and can be deduced from the explanations of the permanent state of the concerned operating mode.

The fact of providing an operation at substantially constant frequency enables to provide an operation of the piezoelectric element at the resonance. This enables not to degrade its quality factor and thus to optimize the efficiency.

It should be noted that the piezoelectric element does not need to be biased, and that the fact of providing, between each phase at constant voltage, a phase during which all switches are off, causing a variation of the voltage across the piezoelectric element, takes part in decreasing switching losses, particularly by a switching at the voltage zero.

Another advantage of the described embodiments is that they are not limited to a specific factor between the value of the input voltage and that of the output voltage.

For a given piezoelectric material, its resonance frequency is known. According to its shape, the maximum amplitude of its oscillations before saturation is also known. This maximum amplitude has a corresponding maximum short-circuit current, which substantially provides the maximum current that can be output during phase I. Similarly, the maximum amplitude has a corresponding maximum off-load voltage which substantially provides the maximum voltages that the input or output voltages may reach.

Figure 17:
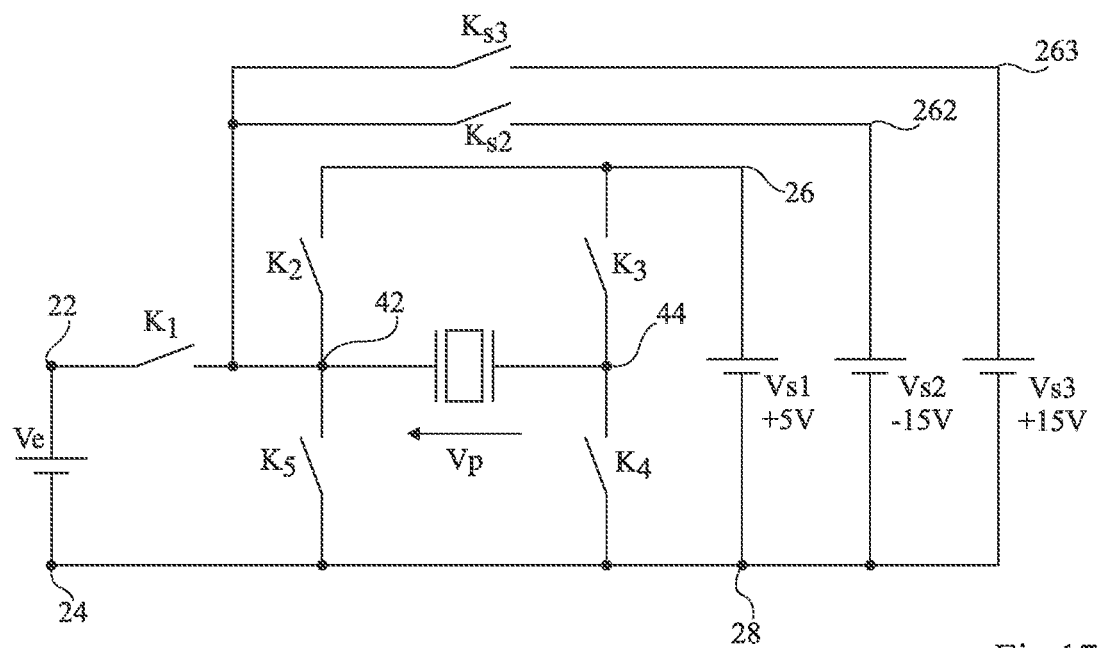
FIG. 17 shows the diagram of an embodiment enabling to supply a plurality of output voltages.

FIG. 17 shows the diagram of an embodiment enabling to provide, from a same piezoelectric element 4 and a same bridge 6, a plurality of output voltages.

The example of FIG. 17 assumes the case where three output voltages Vs1, Vs2, and Vs3, all referenced to the same terminal 28 (confounded with terminal 24) are provided.

The architecture uses the same assembly as in FIG. 3 (switches K1 to K5). Further, a switch Ks2 couples terminal 42 to a positive terminal 262 for supplying voltage Vs2 and a switch Ks3 couples terminal 42 to a positive terminal 263 for supplying voltage Vs3, voltage Vs1 being supplied between terminals 26 and 28.

Figure 18:
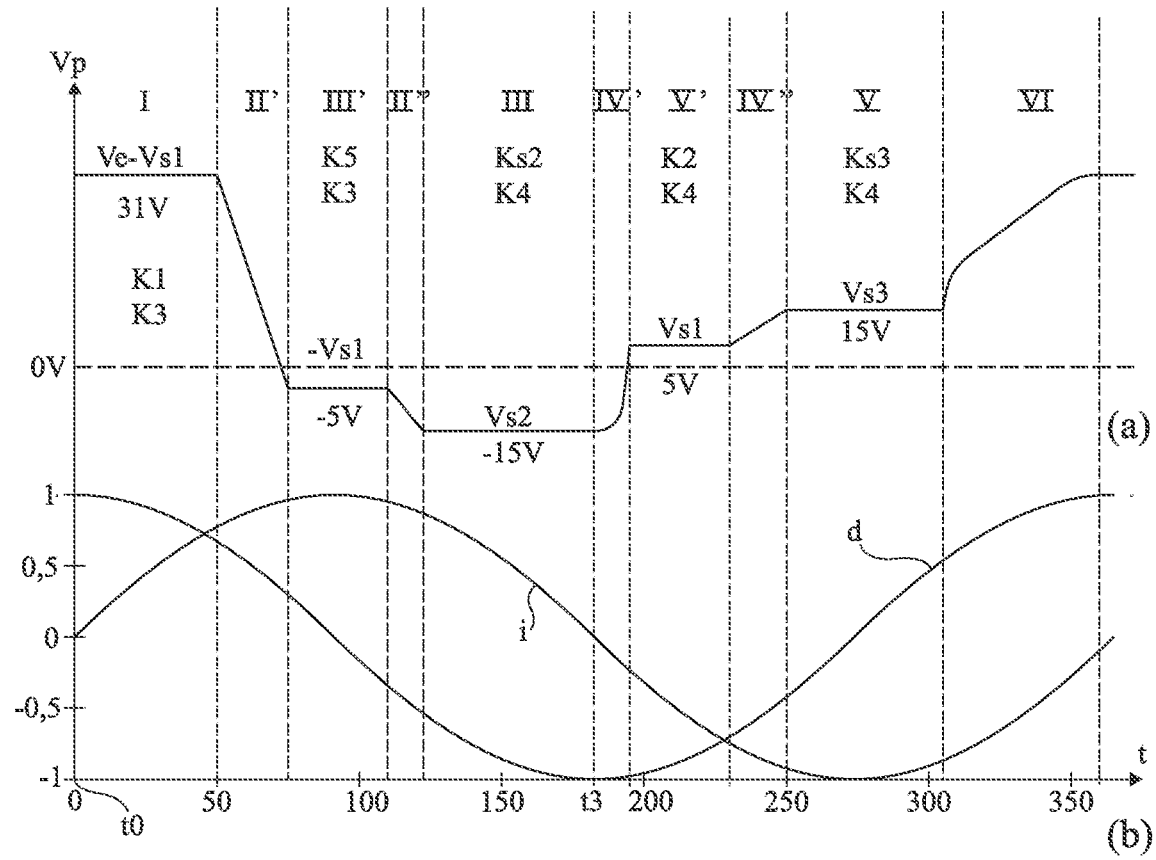
FIG. 18 illustrates, in timing diagrams, a mode of control of the converter of FIG. 17 to obtain a DC/DC buck converter operation.

FIG. 18 illustrates, in timing diagrams, a mode of control of the switches of the converter of FIG. 17 to obtain an operation as a DC/DC buck converter.

View (a) of FIG. 18 illustrates an example of shape of voltage Vp across piezoelectric element 4 during a resonance cycle (period). The scales of voltage Vp and of time t are arbitrary. The example of FIG. 17 assumes voltages Vs1 of 5 volts, Vs2 of −15 volts and Vs3 of 15 volts, and a voltage Ve in the order of 36 volts.

View (b) of FIG. 18 illustrates the mechanical deformation d of piezoelectric element 4 and the value of motional current i in piezoelectric element 4. The scales of deformation d and of motional current i are normalized.

To obtain three output voltages, a cycle comprises ten phases.

It comprises stable phases I, III, and V, respectively of maximum level (Ve-Vs1), minimum level (Vs2), and intermediate level (Vs3).

It also comprises transition phases when all the switches are off. However, phases II and IV are each divided in two, respectively, II', II'', and IV', IV'', to obtain two additional stages, respectively of level −Vs1 (phase III') and of level Vs1 (phase V'). Phase VI between intermediate level V and level I is not modified.

The respective states of the switches during stable phases are respectively:
 switches K1 and K3 on during phase I, voltage Vp then being equal to Ve−Vs1;
 switches K3 and K5 on during phase III', voltage Vp then being equal to −Vs1;
 switches Ks2 and K4 on during phase III, voltage Vp then being equal to Vs2;
 switches K2 and K4 on during phase V', voltage Vp then being equal to Vs1; and
 switches Ks3 and K4 on during phase V, voltage Vp then being equal to Vs3.

In the cycle illustrated in FIG. 18, the maximum (1) of deformation d is at time t0 of switching from phase IV to phase I and the minimum (−1) of deformation d is at time t3 of switching from phase III to phase IV'.

Current i has a sinusoidal shape of same period as deformation d. It crosses zero at times t0 and t3.

The embodiment of FIGS. 17 and 18 illustrates the fact that the described embodiments are not limited to the case of an input voltage, an output voltage, and three phases at constant voltage Vp. In practice, any number of input and/or output voltages and any number of constant voltage/constant charge alternations within a resonance period of the piezoelectric element may be provided.

Figure 19:
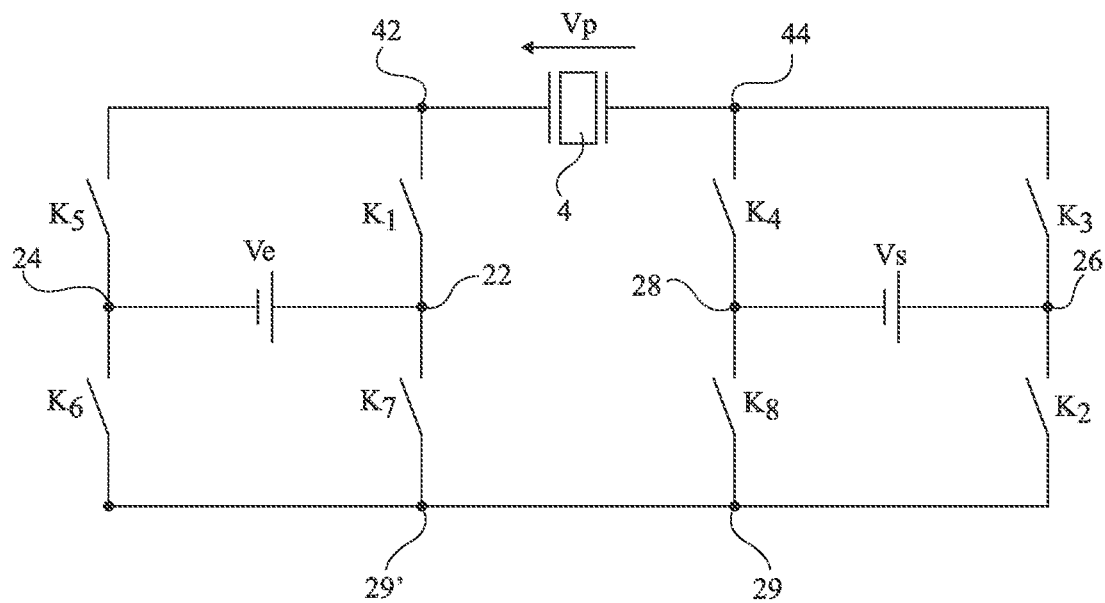
FIG. 19 very schematically shows another embodiment of a converter architecture.

FIG. 19 very schematically shows another embodiment of a converter architecture.

It comprises piezoelectric element 4 and switches K1, K3, K4, and K5 connected, in the same way as in FIG. 3, to terminals 22, 24 of application of voltage Ve and to terminals 26 and 28 for supplying voltage Vs.

However, switch K2 does not directly couple terminals 42 and 26, but couples terminal 26 to a first intermediate node 29. Node 29 is coupled, by a switch K8, to terminal 28.

In the example of FIG. 19, node 29 is connected to a second node 29' which is coupled, by a switch K6, to terminal 24 and, by a switch K7, to terminal 22.

Switching structures of same nature are then available on the side of voltage Ve and on the side of voltage Vs. It is then easier to invert their respective roles.

One can however find the H-bridge structure with the piezoelectric element in the H bar, but this time, with the branches of the H respectively formed of switches K1 and K5 in series and of switches K3 and K4 in series, input terminals 22 and 24 and output terminals 26 and 28 of the converter corresponding to the ends of these branches.

The list of the values that voltage Vp can take according to the values of voltages Ve and Vs according to the configuration of the switches of FIG. 19 in a control cycle is:

Vp=0 V:
  switches K1 and K7 or switches K5 and K6 on;
  switches K4 and K8 or switches K2 and K3 on; and
  the other switches off.
Vp=Ve:
  switches K1 and K6 on;
  switches K4 and K8 or switches K2 and K3 on; and
  the other switches off.
Vp=−Ve:
  switches K5 and K7 on;
  switches K4 and K8 or switches K2 and K3 on; and
  the other switches off.
Vp=Vs:
  switches K1 and K7 or switches K5 and K6 on;
  switches K2 and K4 on; and
  the other switches off.
Vp=−Vs:
  switches K1 and K7 or switches K5 and K6 on;
  switches K3 and K8 on; and
  the other switches off.
Vp=Ve−V s:
  switches K1, K6, K3 and K8 on; and
  the other switches off.
Vp=Vs−Ve:
  switches K5, K7, K4, and K2 on; and
  the other switches off.
Vp=Ve+Vs:
  switches K1, K6, K4, and K2 on; and
  the other switches off.
Vp=−Ve−Vs:
  switches K5, K7, K3, and K8 on; and
  the other switches off.

Such an assembly thus enables to cover all the conversion cases, that is, the inversion or not of the voltage, the raising or the lowering of the voltage, the permutation of the input/output, that is the power transfer from the input to the output or conversely. Further, the increase in the choice of applicable voltage levels enables to optimize the efficiency at each time according to the values of the input and output voltages. It is further possible to generate at the output an AC voltage at a frequency different from the input voltage (but still at a frequency much smaller than the resonance frequency of the piezoelectric) by adapting at each time the transformation ratio and the nature of the conversion (voltage inversion or not).

Figure 20:
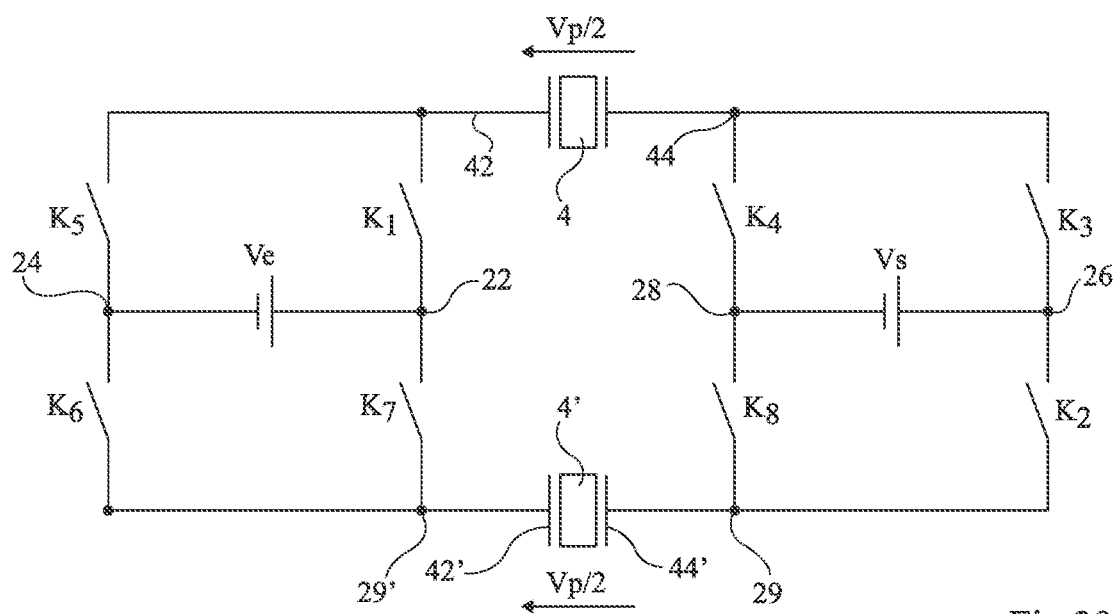
FIG. 20 very schematically shows still another embodiment of a converter architecture.

FIG. 20 very schematically shows still another embodiment of a converter architecture.

This architecture is based on that of FIG. 19, but it is provided to use a second piezoelectric element 4' between nodes 29 and 29'. This amounts to placing two substantially identical piezoelectric elements 4 and 4' in series (they conduct the same current).

The total voltage Vp applied separates in two and each of the piezoelectric elements sees Vp/2. Each of the cycles disclosed in the document are applicable in the same way.

The control sequences of switches K1 to K8 are adapted to the operating mode (boost, buck, inverter), the different control cycles described hereabove being applicable to this architecture.

To ensure the synchronized operation of the two piezoelectric elements, it may be advantageous to have a mechanical link between the two elements (for example, it may be provided to glue them and/or to tighten them to each other, to form them on a same ceramic, to arrange them on a same substrate or on a same printed circuit board, etc.).

An advantage of using two piezoelectric elements as illustrated in FIG. 20 is that output voltage Vs is thus isolated from input voltage Ve, without for all this having to use a transformer. Losses generated by the transformer are thus avoided. This advantage is present even with respect to a piezoelectric transformer, where all the power delivered to the primary is not completely transmitted to the secondary and the primary further has to set a larger mass to motion, that is, that of the primary plus that of the secondary, which generates losses.

In the embodiment of FIG. 20, the isolation is ensured by the fact that the electric impedance of piezoelectric elements 4 and 4' is very high at low frequency (for example, at 50 or 60 Hz corresponding to the frequency of the electric network) Indeed, at low frequency as compared with the resonance frequency of the piezoelectric (for example, in the order of a few hundreds of kHz, or even in the order of a few MHz), the impedance of a piezoelectric element is in the order of one Megohm. The right-hand portion of the two piezoelectric elements (on the side of output Vs) is thus isolated from the left-hand portion (on the side of input Ve) via the high impedance represented by these two elements at low frequency with respect to their resonance frequency.

As a variation, one of the two piezoelectric elements 4 and 4' is replaced with a simple coupling capacitor, aiming at blocking the DC component and the low frequency (<500 Hz). This capacitor is then only used for the low-frequency isolation and does not contribute to the power conversion function. This capacitor may be formed of any number of elementary capacitors placed in series and/or in parallel, for example, to ensure a redundancy and/or security function.

Similarly, a piezoelectric element may be formed of any number of elementary piezoelectric elements placed in series and/or in parallel. Preferably, the elementary piezoelectric elements resonate at frequencies close to one another. Preferably, they are mechanically coupled.

The architecture described in relation with FIGS. 19 and 20 corresponds to providing four branches of switches, each having at least two switches in series. A first branch (switches K1 and K7 in series) and a second branch (switches K5 and K6 in series) are in parallel between a first terminal 42 and a second terminal 29'. The respective junction points of the switches of the first and second branches are coupled, preferably connected, to terminals 22 and 24 of application of input voltage Ve. A third branch (switches K3 and K2 in series) and a fourth branch (switches K4 and K8 in series) are in parallel between a third terminal 44 and a fourth terminal 29. The respective junction points of the switches of the third and fourth branches are coupled, preferably connected, to terminals 26 and 28 for supplying output voltage Vs. In the embodiment of FIG. 19, a piezoelectric element 4 couples first terminal 42 to third terminal 44, and second terminal 29' and fourth terminal 29 are interconnected. According to a variation of FIG. 19, not shown, a capacitive element couples second terminal 29' to fourth terminal 29. In the embodiment of FIG. 20, a first piezoelectric element 4 couples first terminal 42 to third terminal 44, and a second piezoelectric element 4' couples second terminal 29' to fourth terminal 29.

The embodiments of FIGS. 19 and 20, although comprising nine switches, respect the features of the other embodiments, and particularly the synchronization of the cycles of control of the switches with respect to the internal current in the piezoelectric element.

It should be noted that the cycles described in the present disclosure do not operate with an electrostatic structure, since the voltage across the piezoelectric element always transits through 0 and sometimes even takes a negative value.

Among the applications of the different described embodiments, one can mention as an example, as an application of AC/DC conversion, battery chargers, power supplies of electronic devices, for example, phones, tablets, computers, television sets, connected objects, and among applications of DC/DC conversion, the distribution of power supplies under different voltage levels in an electronic device (for example, the power supply voltages of a flash memory, of a RAM, of a display, of a processor core, of a USB port, of a CD player, of a radio unit, of a hard disk, of various peripherals) from a main power supply or a battery. As a specific embodiment, an assembly such as illustrated in FIG. 20 may be used to power a USB port in low-voltage mode, with no electric risk for the user in touching the connector potentials.

In the above discussed embodiments, a battery symbol has been used for input voltage Ve and for output voltage Vs. In practice, it may be any voltage source and any electric load. Further, the filtering capacitors may be arranged in parallel between terminal 22 and 24 and/or between terminals 26 and 28 to stabilize the voltage.

An advantage of the described architecture is that it is compatible with multiple conversion functions.

Another advantage is that it is even possible to modify the switch control law in a same application environment, for example, if voltages Ve and Vs of the application are meant to change during the operation. Further, the input and the output of the converter may be permutated (input Ve of FIG. 3 becomes output Vs and vice versa).

Various embodiments and variations have been described. Certain embodiments and variations may be combined and other variations and modifications will occur to those skilled in the art. In particular, the selection of the voltage levels depends on the application and on the desired gain (higher or lower than 1). Further, the selection of the piezoelectric material also depends on the application, as well as the shape of the element, to satisfy the voltage, current, and resonance frequency constraints. Once the piezoelectric element has been selected, the time intervals between the different cycles depend on the resonance frequency of the piezoelectric material.

Finally, the practical implementation of the embodiments and variations which have been described is within the abilities of those skilled in the art based on the functional indications given hereabove. In particular, the generation of appropriate control signals is within the abilities of those skilled in the art according to the application and to the explanations given hereabove for the desired conduction phases of the different switches.

The invention claimed is:

1. A power converter comprising:
a first branch and a second branch of at least two series-connected switches, each switch in the at least two series-connected switches coupled in parallel between a first terminal and a second terminal and having junction points of each switch in the at least two series-connected switches coupled to a first set of two terminals of application of a first voltage;
a third branch and a fourth branch of the at least two series-connected switches each switch in the at least two series-connected switches coupled in parallel between a third terminal and a fourth terminal, and having junction points of each switch in the at least two series-connected switches coupled to a second set of two terminals for supplying a second voltage; and
at least one first piezoelectric element coupling the first terminal to the third terminal,
wherein turning on of each switch in the at least two series-connected switches is performed under an approximately zero voltage thereacross, control of each switch in the at least two series-connected switches being synchronized with respect to a current internal to the piezoelectric element.

2. The converter of claim 1, wherein the second and fourth terminals are interconnected.

3. The converter of claim 1, wherein at least one capacitive element couples the second terminal to the fourth terminal.

4. The converter of claim 1, wherein at least one second piezoelectric element couples the second terminal to the fourth terminal.

5. The converter of claim 1, wherein each switch in the at least two series-connected switches is controlled to alternate phases at substantially constant voltage and at substantially constant charge between terminals of the piezoelectric element.

6. The converter of claim 1, further comprising a circuit for controlling, in all or nothing, all or part of each switch in the at least two series-connected switches.

7. The converter of claim 6, wherein said circuit is capable of detecting at least one of a time of zero crossing of motional current of the piezoelectric element, and of generating a signal for controlling at least one of the switches in the at least two series-connected switches according to a detected zero crossing time.

8. The converter of claim 7, wherein the detection of the zero crossing is performed by a measurement and a comparison with a zero time of the motional current flowing through the piezoelectric element during a phase at constant voltage, or by a measurement and a comparison with a zero time of a derivative of a voltage across the piezoelectric element during a phase at constant charge, or by a measurement of a deformation of the piezoelectric element and a deduction of the deformation limiting value crossing time.

9. The converter of claim 1, wherein the switches are cyclically controlled at an approximately constant frequency, alternation of the phases at substantially constant voltage and at substantially constant charge across the piezoelectric element being applied for a resonance period of the piezoelectric element.

10. The converter of claim 1, wherein the sum of charges exchanged by the piezoelectric element over a resonance period is substantially zero.

11. The converter of claim 1, comprising:
- at least one first switch coupling the first terminal to one of the two terminals of application of the first voltage;
- at least one second switch coupling one of the two terminals for supplying the second voltage to the fourth terminal;
- at least one third switch coupling the third terminal to said fourth terminal for supplying the second voltage;
- at least one fourth switch coupling the third terminal to another of the two terminals for supplying the second voltage;
- at least one fifth switch coupling the first terminal to another of the two terminals of application of the first voltage;
- at least one sixth switch coupling the another terminal of application of the first voltage to the second terminal;
- at least one seventh switch coupling the first terminal application of the first voltage to the second voltage; and
- at least one eighth switch coupling the another terminal for supplying the second voltage to the fourth terminal.

* * * * *